United States Patent
Jiang et al.

(10) Patent No.: US 8,443,255 B2
(45) Date of Patent: May 14, 2013

(54) PARITY CHECK MATRIX OPTIMIZATION AND SELECTION FOR ITERATIVE DECODING

(75) Inventors: Jing Jiang, San Diego, CA (US); Tao Tian, San Diego, CA (US); Raghuraman Krishnamoorthi, San Diego, CA (US); Xinmiao Zhang, Broadview Heights, OH (US); Ashok Mantravadi, San Diego, CA (US); Krishna Mukkavilli, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 300 days.

(21) Appl. No.: 12/869,555

(22) Filed: Aug. 26, 2010

(65) Prior Publication Data

US 2012/0054585 A1    Mar. 1, 2012

(51) Int. Cl.
  *H03M 13/00*    (2006.01)
(52) U.S. Cl.
  USPC .......................................... 714/758; 714/774
(58) Field of Classification Search .................. 714/774, 714/758
  See application file for complete search history.

(56) References Cited

U.S. PATENT DOCUMENTS

| | | | |
|---|---|---|---|
| 7,519,898 B2 | 4/2009 | Narayanan et al. | |
| 2003/0106008 A1 | 6/2003 | Butler et al. | |
| 2005/0138516 A1 | 6/2005 | Yedidia | |
| 2005/0229091 A1* | 10/2005 | Narayanan et al. | 714/801 |
| 2006/0015791 A1* | 1/2006 | Kikuchi et al. | 714/758 |
| 2007/0101246 A1* | 5/2007 | Kyung et al. | 714/804 |
| 2009/0063926 A1* | 3/2009 | Cho et al. | 714/752 |
| 2009/0271688 A1 | 10/2009 | Jiang et al. | |

FOREIGN PATENT DOCUMENTS

| | | |
|---|---|---|
| WO | WO2006027668 A1 | 3/2006 |
| WO | WO2009023298 A1 | 2/2009 |

OTHER PUBLICATIONS

Aghvami et al: "Belief Propagation Decoding of Reed-Solomon Codes; a Bit-Level Soft Decision Decoding Algorithm", IEEE Transactions on Broadcasting, IEEE Service Center, Piscataway, NJ, US, vol. 51, No. 1, Mar. 1, 2005, pp. 106-113, XP011127922, ISSN: 0018-9316, DOI : 10.1109/TBC. 2005.843984.

Cai et al: "Comparison of Concatenated Reed-Solomon Coding with Hard-decision to Soft-decision LDPC Coding for the Rayleigh Fading Channel", Information Theory Workshop, IEEE, Piscataway, NJ, US, Oct. 1, 2006, pp. 135-139, XP031055509, DOI : 10.1109/ITW2. 2006.323773 ISBN: 978-1-4244-0067-6.

Chari et al., "FLO Physical Layer: An Overview" IEEE Transactions on Broadcasting, vol. 53, No. 1, Mar. 1, 2007, pp. 145-160, XP011172013, IEEE Service Center, Piscataway, NJ, US, Issn: 0018-9316, Abstract; Figures 8,11,13, Sections IV.C.4), IV.C.8), IV.C.9 Standards.

(Continued)

*Primary Examiner* — M. Mujtaba K Chaudry
(74) *Attorney, Agent, or Firm* — Fulbright & Jaworski L.L.P.

(57) ABSTRACT

A method of generating a parity check matrix for iterative decoding of a linear block code includes: determining a set of parity check vectors for the linear block code; ordering according to Hamming weight non-zero parity check vectors of the set; selecting a criterion for generating the parity check matrix; and building the parity check matrix by incrementally selecting according to the criterion a parity check vector for each consecutive row of the parity check matrix, wherein the parity check vector is selected from the ordered non-zero parity check vectors remaining in the set.

36 Claims, 8 Drawing Sheets

OTHER PUBLICATIONS

Hehn et al: "Multiple-Bases Belief-Propagation for Decoding of Short Block Codes", Proc. IEEE International Symposium on Information Theory 2007 (ISIT 2007), IEEE, Piscataway, NJ, USA, Jun. 24, 2007, pp. 311-315, XP031440736, ISBN : 978-1-4244-1397-3.

Honary et al: "Construction of well-structured quasi-cyclic low-density parity check codes; Capacity Approaching Codes Design and Implementation", IEEE Proceedings : Communications, Institution of Electrical Engineers, GB, vol. 152, No. 6, Dec. 9, 2005, pp. 1081-1085, XP006025745, ISSN: 1350-2425, DOI : 10.1049/IP-COM:20050202.

International Search Report and Written Opinion—PCT/US2011/048853—ISA/EPO—Mar. 8, 2012.

Metzner et al: "Vector Symbol Decoding With List Inner Symbol Decisions", IEEE Transactions on Communications, IEEE Service Center, Piscataway, NJ, USA, vol. 51, No. 3, Mar. 1, 2003, XP011071150, ISSN: 0090-6778.

Shayegh et al: "A Low Complexity Iterative Technique for Soft Decision Decoding of Reed-Solomon Codes", Proc IEEE International Conference on Communications 2009, IEEE, Piscataway, NJ, USA, Jun. 14, 2009, pp. 1-6, XP031505599, ISBN: 978-1-4244-3435-0.

Lucas, R. et al., "On Iterative Soft-Decision Decoding of Linear Binary Block Codes and Product Codes", IEEE Journal on Selected Areas in Communications, Feb. 1998, vol. 16, No. 2, pp. 276-296.

Richardson, T. J., et al., "Design of Capacity-Approaching Irregular Low-Density Parity-Check Codes", IEEE Transactions on Information Theory, Feb. 2001, vol. 47, No. 2, pp. 619-637.

Yedidia, J., et al., "Generating Code Representations Suitable for Belief Propagation Decoding", Proceedings of the $40^{th}$ Annual Allerton Conference on Communications, Control, and Computing, Oct. 2002, 13 pages.

* cited by examiner

PARITY CHECK MATRIX OPTIMIZATION AND SELECTION FOR ITERATIVE DECODING

CROSS-REFERENCES TO RELATED APPLICATIONS

The following references are herein incorporated by reference in their entirety for all purposes:

U.S. Patent Publication No. 2009/0271688, entitled "Communication Signal Decoding with Iterative Cooperation Between Inner and Outer Codes," published Oct. 29, 2009, naming Jiang, et al. (hereinafter "Jiang"); and M. R. Chari, F. Ling, A. Mantravadi, R. Krishnamoorthi, R. Vijayan, G. K. Walker, and R. Chandhok, "FLO physical layer: An Overview," IEEE Trans. Broadcast., vol. 53, no. 1, pt. 2, pp. 145-160, March 2007 (hereinafter "Chari").

BACKGROUND

A content delivery system can be or include a wireless content delivery system, such as the MediaFLO™ system developed by QUALCOMM Incorporated of San Diego, Calif. The content delivery system can be or include a content delivery platform based on wired or optical connections, in addition to or instead of a wireless interface. In general, the content delivered by the content delivery system can include video media, such as video clips encoded in the Real™ format, the Motion Pictures Group (.mpg) format, the Windows Media format by Microsoft Corp., or other video codec or format. The content can include audio media, such as music tracks or broadcast recordings encoded in Motion Pictures Expert Group (MPEG)-1 Audio Layer 3 (MP3) format, Microsoft Corp. ".wav" format, RealAudio™ format, or other audio codec or format. The content can further include textual content, such as streaming stock quotes, weather reports, or other data.

In a content delivery system, data can be transmitted via a set of logical channels. In some implementations, a set of logical channels can comprise a set of multicast logical channels (MLCs) such as those employed in the aforementioned MediaFLO™ system. The use of a set of logical channels can increase the time diversity of data received within a superframe, improving reception of the data.

Advanced forward error correction techniques can also be implemented to protect the data during transmission. The MediaFLO™ system uses a concatenated coding scheme with Reed-Solomon coding for an outer code and turbo coding for an inner code. Conventional concatenated coding schemes of this type provide hard decision inputs to a Reed-Solomon erasure decoder at the receiver, where recovery of erased symbols is not attempted if the number of erasures is greater than the redundancy of the Reed-Solomon code. Iterative turbo-Reed-Solomon decoding using a Reed-Solomon soft input-soft output (SISO) decoder, as described in "Jiang," can provide improved performance relative to the performance of the conventional concatenated coding scheme using a Reed-Solomon erasure decoder. Iterative decoding based on parity check matrix can be an efficient method for decoding some codes. However, this type of iterative decoding is suboptimal for codes associated with dense parity check matrices, such as Reed-Solomon codes. The iterative decoding performance largely depends on the particular parity check matrix used.

SUMMARY

An example of a method of generating a parity check matrix for iterative decoding of a linear block code according to the disclosure includes: determining a set of parity check vectors for the linear block code; ordering according to Hamming weight non-zero parity check vectors of the set; selecting a criterion for generating the parity check matrix; and building the parity check matrix by incrementally selecting according to the criterion a parity check vector for each consecutive row of the parity check matrix, the parity check vector selected from the ordered non-zero parity check vectors remaining in the set.

Embodiments of such a method may include one or more of the following features. Determining the set of parity check vectors includes determining the set of all unique parity check vectors for the linear block code. The criterion is a parity check matrix having a minimum weight; and building the parity check matrix includes incrementally selecting a next ordered non-zero parity check vector remaining in the set for each consecutive row of the parity check matrix. The criterion is a parity check matrix having a low weight; and building the parity check matrix includes incrementally selecting a parity check vector with a Hamming weight less than or equal to a threshold weight for each consecutive row of the parity check matrix, the parity check vector selected from the ordered non-zero parity check vectors remaining in the set. The criterion is a parity check matrix having a regular degree profile; and building the parity check matrix includes incrementally selecting a parity check vector that minimizes column weight variance of the parity check matrix being built, the parity check vector selected for each consecutive row of the parity check matrix, the parity check vector selected from the ordered non-zero parity check vectors remaining in the set. The criterion is a parity check matrix having an irregular degree profile; and building the parity check matrix includes incrementally selecting a parity check vector that minimizes square error between an interpolated column weight cumulative distribution function of the parity check matrix being built and a target column weight cumulative distribution function having the irregular degree profile, the parity check vector selected for each consecutive row of the parity check matrix, the parity check vector selected from the ordered non-zero parity check vectors remaining in the set. The criterion is a parity check matrix having few length-4 cycles; and building the parity check matrix includes incrementally selecting a parity check vector that minimizes a maximum inner product between previously selected parity check vectors of the parity check matrix being built and a candidate parity check vector considered for selection, the parity check vector selected for each consecutive row of the parity check matrix, the parity check vector selected from the ordered non-zero parity check vectors remaining in the set. The method further includes adding redundant rows to the parity check matrix. The linear block code is a Reed-Solomon code. The method further includes modifying the parity check matrix by performing one or more row operations to form in the modified parity check matrix a sparse sub-matrix corresponding to a possible erasure pattern in a received codeword of the linear block code.

An example of a method of decoding data transmitted on a communication link of a communication system includes: receiving data transmitted on the communication link; inner decoding the received data with an inner code; determining a portion of output of the inner decoding that is incorrectly decoded by the inner decoding; selecting a parity check matrix from a set of parity check matrices for iterative decoding, the selected parity check matrix having a sparse sub-matrix corresponding to the portion of the output of the inner decoding that is incorrectly decoded; and outer decoding the output of the inner decoding with an outer code, wherein outer decoding includes iteratively decoding using the sparse sub-matrix corresponding to the portion of the output of the inner decoding that is incorrectly decoded.

Embodiments of such a method may include one or more of the following features. Determining the portion includes calculating a cyclic redundancy check using the output of the inner decoding. The parity check matrices of the set are generated using one or more of the following criteria: minimum weight, low weight, a regular degree profile, an irregular degree profile, and few length-4 cycles. Each parity check matrix of the set is generated to match a respective possible erasure pattern in a received codeword of the outer code. Outer decoding includes iteratively decoding using one or more of belief propagation, sum product algorithm, belief accumulation, and min-sum algorithm. The outer code is a Reed-Solomon code.

An example of an apparatus configured to generate a parity check matrix for iterative decoding of a linear block code includes: a processor configured to determine a set of parity check vectors for the linear block code, order according to Hamming weight non-zero parity check vectors of the set, select a criterion for generating the parity check matrix, and build the parity check matrix by incrementally selecting according to the criterion a parity check vector for each consecutive row of the parity check matrix, wherein the parity check vector is selected from the ordered non-zero parity check vectors remaining in the set.

Embodiments of such an apparatus may include one or more of the following features. The processor is configured to determine the set of parity check vectors including determining the set of all unique parity check vectors for the linear block code. The criterion is a parity check matrix having a minimum weight; and the processor is configured to build the parity check matrix by incrementally selecting a next ordered non-zero parity check vector remaining in the set for each consecutive row of the parity check matrix. The criterion is a parity check matrix having a low weight; and the processor is configured to build the parity check matrix by incrementally selecting a parity check vector with a Hamming weight less than or equal to a threshold weight for each consecutive row of the parity check matrix, wherein the parity check vector is selected from the ordered non-zero parity check vectors remaining in the set. The criterion is a parity check matrix having a regular degree profile; and the processor is configured to build the parity check matrix by incrementally selecting a parity check vector that minimizes column weight variance of the parity check matrix being built, wherein the parity check vector is selected for each consecutive row of the parity check matrix and selected from the ordered non-zero parity check vectors remaining in the set. The criterion is a parity check matrix having an irregular degree profile; and the processor is configured to build the parity check matrix by incrementally selecting a parity check vector that minimizes square error between an interpolated column weight cumulative distribution function of the parity check matrix being built and a target column weight cumulative distribution function having the irregular degree profile, wherein the parity check vector is selected for each consecutive row of the parity check matrix and selected from the ordered non-zero parity check vectors remaining in the set. The criterion is a parity check matrix having few length-4 cycles; and the processor is configured to build the parity check matrix by incrementally selecting a parity check vector that minimizes a maximum inner product between previously selected parity check vectors of the parity check matrix being built and a candidate parity check vector considered for selection, wherein the parity check vector is selected for each consecutive row of the parity check matrix and selected from the ordered non-zero parity check vectors remaining in the set. The processor is further configured to add redundant rows to the parity check matrix. The linear block code is a Reed-Solomon code. The processor is further configured to modify the parity check matrix including performing one or more row operations to form in the modified parity check matrix a sparse sub-matrix corresponding to a possible erasure pattern in a received codeword of the linear block code.

An example of an apparatus configured to decode data transmitted on a communication link of a communication system includes: an input configured to receive data transmitted on the communication link; an inner decoder communicatively coupled to the input and configured to decode the received data with an inner code; a processor communicatively coupled to the inner decoder and configured to determine a portion of output of the inner decoder that is incorrectly decoded by the inner decoder, and select a parity check matrix from a set of parity check matrices for iterative decoding, wherein the selected parity check matrix has a sparse sub-matrix corresponding to the portion of the output of the inner decoder that is incorrectly decoded; and an outer decoder communicatively coupled to the processor and the inner decoder and configured to decode the output of the inner decoder with an outer code, including iteratively decoding using the sparse sub-matrix corresponding to the portion of the output of the inner decoder that is incorrectly decoded.

Embodiments of such an apparatus may include one or more of the following features. The processor is configured to determine the portion including calculating a cyclic redundancy check using the output of the inner decoder. The parity check matrices of the set are generated using one or more of the following criteria: minimum weight, low weight, a regular degree profile, an irregular degree profile, and few length-4 cycles. Each parity check matrix of the set is generated to match a respective possible erasure pattern in a received codeword of the outer code. The outer decoder is configured to decode including iteratively decoding using one or more of belief propagation, sum product algorithm, belief accumulation, and min-sum algorithm. The outer decoder is a Reed-Solomon decoder.

An example of a computer program product includes a processor-readable medium storing processor-readable instructions configured to cause a processor to: determine a set of parity check vectors for a linear block code; order according to Hamming weight non-zero parity check vectors of the set; select a criterion for generating a parity check matrix for iterative decoding of the linear block code; and build the parity check matrix by incrementally selecting according to the criterion a parity check vector for each consecutive row of the parity check matrix, the parity check vector selected from the ordered non-zero parity check vectors remaining in the set.

Embodiments of such a product may include one or more of the following features. The instructions configured to cause the processor to determine the set of parity check vectors include instructions configured to cause the processor to determine the set of all unique parity check vectors for the linear block code. The criterion is a parity check matrix having a minimum weight; and the instructions configured to cause the processor to build the parity check matrix include instructions configured to cause the processor to incrementally select a next ordered non-zero parity check vector remaining in the set for each consecutive row of the parity check matrix. The criterion is a parity check matrix having a low weight; and the instructions configured to cause the processor to build the parity check matrix include instructions configured to cause the processor to incrementally select a parity check vector with a Hamming weight less than or equal to a threshold weight for each consecutive row of the parity check matrix, the parity check vector selected from the ordered non-zero parity check vectors remaining in the set. The criterion is a parity check matrix having a regular degree profile; and the instructions configured to cause the processor to build the parity check matrix include instructions configured to cause the processor to incrementally select a parity check vector that minimizes column weight variance of the parity check matrix being built, the parity check vector selected for each consecutive row of the parity check matrix, the parity check vector selected from the ordered non-zero parity check vectors remaining in the set. The criterion is a parity check matrix having an irregular degree profile; and the instructions configured to cause the processor to build the parity check matrix include instructions configured to cause the processor to incrementally select a parity check vector that minimizes square error between an interpolated column weight cumulative distribution function of the parity check matrix being built and a target column weight cumulative distribution function having the irregular degree profile, the parity check vector selected for each consecutive row of the parity check matrix, the parity check vector selected from the ordered non-zero parity check vectors remaining in the set. The criterion is a parity check matrix having few length-4 cycles; and the instructions configured to cause the processor to build the parity check matrix include instructions configured to cause the processor to incrementally select a parity check vector that minimizes a maximum inner product between previously selected parity check vectors of the parity check matrix being built and a candidate parity check vector considered for selection, the parity check vector selected for each consecutive row of the parity check matrix, the parity check vector selected from the ordered non-zero parity check vectors remaining in the set. The instructions are further configured to cause the processor to add redundant rows to the parity check matrix. The linear block code is a Reed-Solomon code. The instructions are further configured to cause the processor to modify the parity check matrix by performing one or more row operations to form in the modified parity check matrix a sparse sub-matrix corresponding to a possible erasure pattern in a received codeword of the linear block code.

An example of a computer program product includes a processor-readable medium storing processor-readable instructions configured to cause a processor to: receive data transmitted on a communication link of a communication system; inner decode the received data with an inner code; determine a portion of output of the inner decoding that is incorrectly decoded by the inner decoding; select a parity check matrix from a set of parity check matrices for iterative decoding, the selected parity check matrix having a sparse sub-matrix corresponding to the portion of the output of the inner decoding that is incorrectly decoded; and outer decode the output of the inner decoding with an outer code, wherein outer decoding includes iteratively decoding using the sparse sub-matrix corresponding to the portion of the output of the inner decoding that is incorrectly decoded.

Embodiments of such a product may include one or more of the following features. The instructions configured to cause the processor to determine the portion include instructions configured to cause the processor to calculate a cyclic redundancy check using the output of the inner decoding. The parity check matrices of the set are generated using one or more of the following criteria: minimum weight, low weight, a regular degree profile, an irregular degree profile, and few length-4 cycles. Each parity check matrix of the set is generated to match a respective possible erasure pattern in a received codeword of the outer code. The instructions configured to cause the processor to outer decode include instructions configured to cause the processor to iteratively decode using one or more of belief propagation, sum product algorithm, belief accumulation, and min-sum algorithm. The outer code is a Reed-Solomon code.

An example of an apparatus configured to generate a parity check matrix for iterative decoding of a linear block code includes: means for determining a set of parity check vectors for the linear block code; means for ordering according to Hamming weight non-zero parity check vectors of the set; means for selecting a criterion for generating the parity check matrix; and means for building the parity check matrix by incrementally selecting according to the criterion a parity check vector for each consecutive row of the parity check matrix, the parity check vector selected from the ordered non-zero parity check vectors remaining in the set.

Embodiments of such an apparatus may include one or more of the following features. The means for determining the set of parity check vectors include means for determining the set of all unique parity check vectors for the linear block code. The criterion is a parity check matrix having a minimum weight; and the means for building the parity check matrix include means for incrementally selecting a next ordered non-zero parity check vector remaining in the set for each consecutive row of the parity check matrix. The criterion is a parity check matrix having a low weight; and the means for building the parity check matrix include means for incrementally selecting a parity check vector with a Hamming weight less than or equal to a threshold weight for each consecutive row of the parity check matrix, the parity check vector selected from the ordered non-zero parity check vectors remaining in the set. The criterion is a parity check matrix having a regular degree profile; and the means for building the parity check matrix include means for incrementally selecting a parity check vector that minimizes column weight variance of the parity check matrix being built, the parity check vector selected for each consecutive row of the parity check matrix, the parity check vector selected from the ordered non-zero parity check vectors remaining in the set. The criterion is a parity check matrix having an irregular degree profile; and the means for building the parity check matrix include means for incrementally selecting a parity check vector that minimizes square error between an interpolated column weight cumulative distribution function of the parity check matrix being built and a target column weight cumulative distribution function having the irregular degree profile, the parity check vector selected for each consecutive row of the parity check matrix, the parity check vector selected from the ordered non-zero parity check vectors remaining in the set. The criterion is a parity check matrix having few length-4 cycles; and the means for building the parity check matrix include means for incrementally selecting a parity check vector that minimizes a maximum inner product between previously selected parity check vectors of the parity check matrix being built and a candidate parity check vector considered for selection, the parity check vector selected for each consecutive row of the parity check matrix, the parity check vector selected from the ordered non-zero parity check vectors remaining in the set. The apparatus further includes means for adding redundant rows to the parity check matrix. The linear block code is a Reed-Solomon code. The apparatus further includes means for modifying the parity check matrix by performing one or more row operations to form in the modified parity check matrix a sparse sub-matrix corresponding to a possible erasure pattern in a received codeword of the linear block code.

An example of an apparatus configured to decode data transmitted on a communication link of a communication system includes: means for receiving data transmitted on the communication link; means for inner decoding the received data with an inner code; means for determining a portion of output of the inner decoding that is incorrectly decoded by the inner decoding; means for selecting a parity check matrix from a set of parity check matrices for iterative decoding, the selected parity check matrix having a sparse sub-matrix corresponding to the portion of the output of the inner decoding that is incorrectly decoded; and means for outer decoding the output of the inner decoding with an outer code, wherein outer decoding includes iteratively decoding using the sparse sub-matrix corresponding to the portion of the output of the inner decoding that is incorrectly decoded.

Embodiments of such an apparatus may include one or more of the following features. The means for determining the portion include means for calculating a cyclic redundancy check using the output of the inner decoding. The parity check matrices of the set are generated using one or more of the following criteria: minimum weight, low weight, a regular degree profile, an irregular degree profile, and few length-4 cycles. Each parity check matrix of the set is generated to match a respective possible erasure pattern in a received codeword of the outer code. The means for outer decoding include means for iteratively decoding using one or more of belief propagation, sum product algorithm, belief accumulation, and min-sum algorithm. The outer code is a Reed-Solomon code.

Items and/or techniques described herein may provide one or more of the following capabilities. Sparse parity check matrices can be generated by the described techniques according to one or more criteria for improved decoding performance of linear block codes. Further decoding improvements can be achieved by optimizing parity check matrices to account for a particular frame structure used for transmitting coded data. The parity check matrices are optimized to include sparse sub-matrices that match possible erasure patterns in received codewords of the linear block code. The receiver need only store the unique sparse sub-matrices of the optimized parity check matrices. Decoding at the receiver can be adapted in real time by selecting the pre-optimized parity check matrix with sparse sub-matrices matching the erasure pattern of the present received codeword. Efficient iterative decoding of the linear block code can then be performed using just the stored sparse sub-matrices of the selected pre-optimized parity check matrix. Processing complexity can also be reduced, because iterative decoding of the linear block code can then be performed using just the stored subset of the selected pre-optimized parity check matrix. While item/technique-effect pairs have been described, it may be possible for a noted effect to be achieved by means other than those noted, and a noted item/technique may not necessarily yield the noted effect.

In the figures, components with similar relevant characteristics and/or features may have the same reference label.

DETAILED DESCRIPTION

Techniques described herein provide mechanisms for generating parity check matrices for iterative decoding of a linear block code. A set of parity check vectors is determined for the linear block code. The non-zero parity check vectors of the set are ordered according to Hamming weight. A criterion for generating the parity check matrix is selected, and the parity check matrix is built incrementally by selecting, according to the criterion, a parity check vector for each consecutive row of the parity check matrix. The parity check vector is selected from the ordered non-zero parity check vectors remaining in the set. In some implementations, the parity check matrix is modified by performing one or more row operations to form, in the modified parity check matrix, one or more sparse sub-matrices corresponding to a possible erasure pattern in a received codeword of the linear block code. Techniques are also provided for decoding data transmitted on a communication link, including selecting for iterative decoding a pre-optimized parity check matrix having one or more sparse sub-matrices corresponding to a determined erasure pattern in the presently received codeword of the linear block code. Other embodiments are within the scope of the disclosure and claims.

Mobile Broadcast System

Figure 1:
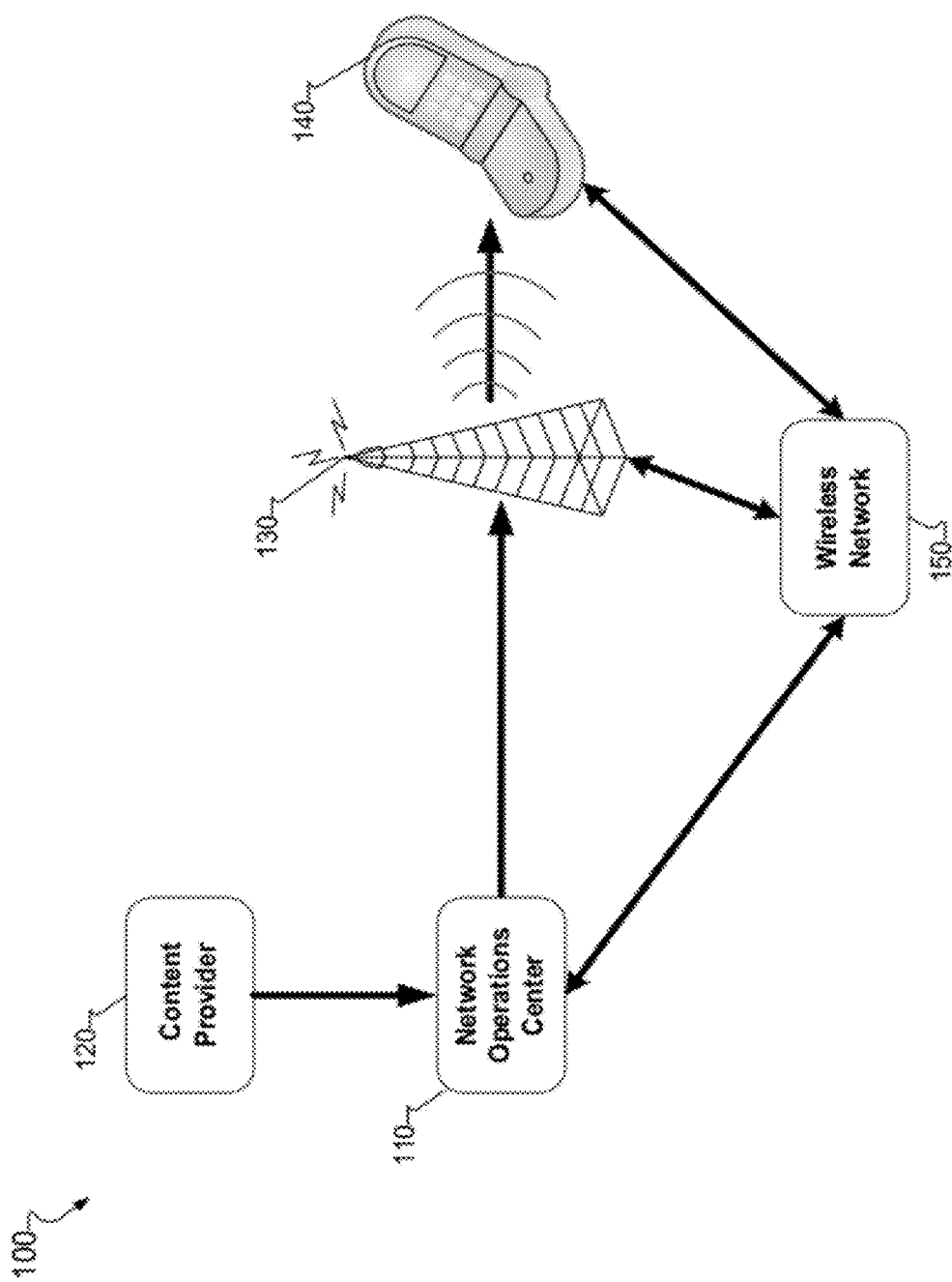
FIG. 1 illustrates an exemplary mobile broadcast system.

FIG. 1 illustrates an exemplary mobile broadcast system 100. The mobile broadcast system operates in accordance with the standards published by the FLO forum, and in particular is typified by the MediaFLO™ broadcast system by QUALCOMM Incorporated of San Diego, Calif. Using a cellular standard, such as GSM or CDMA, enables MediaFLO™ to provide security and services utilizing unicasting associated with a wireless paradigm. The MediaFLO™ mobile broadcast platform delivers content across a mobile environment. MediaFLO™ utilizes a combination of broadcast and wireless paradigms to provide business opportunities within a mobile broadcast ecosystem. Using the Forward Link Only (FLO) air interface standard, MediaFLO™ provides greater content capacity and reduced content delivery costs associated with broadcasting paradigms.

MediaFLO™, or FLO™, technology is designed to meet the mobile entertainment requirements of end users and service providers, by, for example, providing television services to end users and features designed to facilitate monetization by service providers. MediaFLO™ provides a broad range of content to mobile devices in a spectrally efficient, cost-effective and designed for low power consumption system. For example, the MediaFLO™ system can deliver streaming television, video and audio, Clipcast™ video and audio, and real-time Internet Protocol (IP) data services to MediaFLO™ compatible mobile devices. The mobile devices can selectively receive, display, play, store, and manipulate the content delivered over the mobile broadcast system 100. Devices usable with the MediaFLO™ system include smartphones, cellular phones, personal digital assistants (PDA), interactive game devices, notebooks, smartbooks, netbooks, data processing apparatus, or other such electronic devices.

MediaFLO™ also can be configured to group programming into one or more subscription packages. Users, or subscribers, operating MediaFLO™ compatible mobile devices can select one or more of the MediaFLO™ subscription packages. For example, reception and decoding of channels included in a MediaFLO™ subscription package can be enabled in response to user input, e.g., touching a touchscreen on a MediaFLO™ compatible mobile device. Any number of conditional access solutions (CAS) can be utilized for controlling access to MediaFLO™ content and services. Additionally, the mobile broadcast system 100 can maintain quality by providing service flexibility with variable bit rate encoding. Variable bit rate encoding balances bandwidth, which is important to the service operator, with high-quality audio and video, which makes the end user experience more enjoyable.

MediaFLO™ end user services can include real-time content delivery, such as video and audio presentations, audio only programming and audio with slides programming. In some implementations, the real-time services can include enhanced H.264 video and AAC+ audio formats. End user services also can include non-real-time content delivery, such as network scheduled delivery of audio clips, e.g., MP4, and multimedia files, e.g., JPEG, PNG, and HTML. Non-real-time services generally comprise the mobile device capturing specific pieces of multimedia and other data for presentation at a later time. For example, a non-real-time service called "clipcasting" provides network scheduled delivery of data services and files, such as wallpaper or e-coupons, for capture by a mobile device. Additionally, Clipcast can be implemented to deliver multimedia clips with multi-presentation views, e.g., from a plurality of perspectives, to a mobile device in accordance with a network schedule.

The mobile broadcast system 100 also can enable audio and video clips, or multimedia clips, to be stored at the MediaFLO™ compatible mobile device in internal memory, external memory, or both. End users can view, listen, and play any stored clip that has not expired. In some implementations, the mobile device can include a file cache size that is configurable by the service operator, the end user, or both.

Additionally, MediaFLO™ can offer end user IP data services, such as FLO network delivery of Internet traffic to third-party applications. Third-party mobile applications can provide end users with dynamic home pages, that include, e.g., stock, news, weather and sports information. For example, the delivery of IP data services can enable stock tickers to be tailored to a user's specific profile. Additionally, MediaFLO™ can be integrated with two-way data exchange applications, such as text and voice chat, live voting, email and web browsing, video-on-demand and shopping, in addition to other interactive mobile application features. With such interactivity, a user can obtain additional information associated with the real-time or non-real-time programming. For example, a dinner recipe may be downloaded during the broadcast of a cooking show and shared with a user's friends, e.g., via a SMS message.

Referring once again to FIG. 1, the mobile broadcast system 100 generally comprises multiple nodes 110-140 that communicate, for example, over a wireless network 150. The wireless network 150, also referred to as a "wireless communication system," encompasses both the physical network as well as digital signal technology. The wireless network 150 can be implemented as: a code division multiple access (CDMA) system; a frequency division multiple access (FDMA) system; a time division multiple access (TDMA) system such as Global System for Mobile communications (GSM), GSM/General Packet Radio Service (GPRS), Enhanced Data GSM Environment (EDGE) or Terrestrial Trunked Radio (TETRA); a Wideband CDMA (WCDMA) system; Evolution Data Optimized (EV-DO) systems such as 1xEV-DO, EV-DO Rev A or EV-DO Rev B; High Speed Packet Access (HSPA) systems such as High Speed Downlink Packet Access (HSDPA), High Speed Uplink Packet Access (HSUPA) or Evolved High Speed Packet Access (HSPA+); a Long Term Evolution (LTE) system; or other communications systems, such as a system utilizing 3G or 4G technology. Content distributed over the interconnected nodes 110-140 can be selectively received, transmitted, processed, stored, and displayed.

The nodes of the mobile broadcast system 100 generally comprise a network operations center 110, one or more content providers 120, one or more FLO transmitters 130, and a plurality of mobile devices 140. The network operations center 110 can include one or more receivers (not shown) configured to receive content from one or more content providers 120. In some implementations, the receivers can reside at the network operations center 110. For example, the network operations center 110 can include a C-band receiver configured to receive content delivered by a C-band satellite content provider 120. In other implementations, the receivers can be located remotely from the network operations center 110 and can deliver the received content to the network operations center 110 using wired or wireless technology. The content received from the one or more content providers 120 can include local and national content. The local and national content can include real-time, non-real-time and IP data services content.

The real-time content can be received from C-band and Ku-band satellites, terrestrial broadcast transmitters, and data networks, in addition to other such transmitting devices and networks. The real-time content can include video, such as MPEG-2 over asynchronous serial interface, or YUV over serial digital interface. The real-time content also can include audio, such as AC-3 or MP2 over ASI, as well as PCM over SDI. Additionally, real-time content formatted in NTSC and PAL technologies can be delivered to the network operations center 110. Real-time MediaFLO™ content and services can be implemented to bring television experiences, similar to those experienced on a traditional television, to a mobile device. For example, the television experiences can include general entertainment programming, such as live sporting events, news, music concerts, and weather updates.

Similarly, non-real-time content formatted in MPV, such as MPEG-4 audio and video clips, and data services via Clipcast (DSvC), such as JPEG, PNG and HTML files, also can be received at the network operations center 110. The network operations center 110 can process the non-real-time content and can schedule network delivery of the content to one or more mobile devices. MediaFLO™'s non-real-time content and file delivery can extend the user experience to include short clips, e.g., YouTube™ videos, and files of non-real-time content, e.g., stored audio files.

In addition, MediaFLO™ can be implemented to deliver IP data services content, such as stock tickers, weather and news updates to the network operations center 110. The IP data services content can include a broad range of information accessible to each MediaFLO™ subscriber. In some implementations, the IP data services content can be tailored to a user's specific profile. For example, a MediaFLO™ subscriber can choose to receive particular IP data services content, such as weather and sports scores, at their MediaFLO™ compatible mobile device. Both the non-real-time and IP data services content can be delivered to the network operations center 110 over one or more data networks.

In some implementations, the network operations center 110 can aggregate the content received from the one or more content providers 120. In some implementations, the network operations center 110 can include additional content, such as locally stored content in the multiplexed content data stream. The aggregated content can be multiplexed at the network operations center 110 and distributed as a content data stream to one or more FLO transmitters 130. The one or more FLO transmitters 130 can receive the multiplexed content data stream from the network operations center 110. Based on the multiplexed content data stream, the FLO transmitters 130 can generate one or more FLO waveforms. The one or more FLO waveforms can be transmitted to one or more mobile devices 140.

Figure 2:
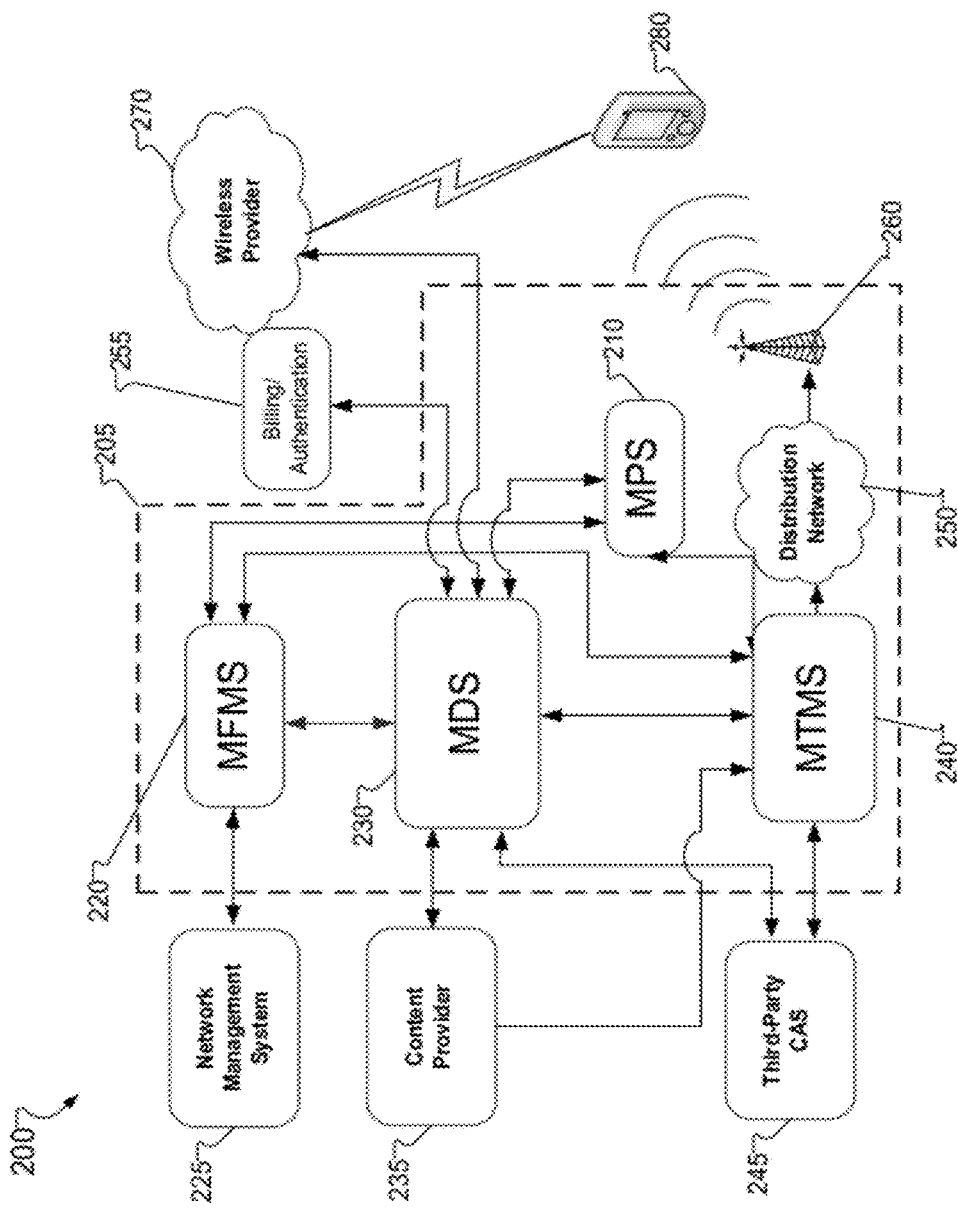
FIG. 2 illustrates an exemplary MediaFLO™ system logical architecture.

Text, graphical and video content received from the FLO transmitters 130 can be displayed on a display screen at the mobile device 140. Audio content received from the FLO transmitters 130 can be played back at one or more audio outputs at the mobile device 140. The mobile device 140 can include an external and internal memory module that can store the received content. In some implementations, the mobile device 140 can communicate with the network operations center 110 over a reverse link, such as the wireless network 150. The reverse links can be used to communicate information for mobile device 140 activations, service key distribution, subscriptions, and usage tracking MediaFLO™ System Logical Architecture FIG. 2 illustrates an exemplary MediaFLO™ system logical architecture 200. The MediaFLO™ system logical architecture 200 includes one or more systems, subsystems, and components, a subset of which constitute a MediaFLO™ network 205. The MediaFLO™ network 205 generally comprises a MediaFLO™ Provisioning System (MPS) 210, a MediaFLO™ Management System (MFMS) 220, a MediaFLO™ Distribution System (MDS) 230, and a MediaFLO™ Transcode and Multiplex System (MTMS) 240. The MediaFLO™ network 205 may be implemented in the network operations center 110 depicted in FIG. 1. The MediaFLO™ network 205 also includes a FLO Radio Access Network (RAN) subsystem, comprising the MTMS 240, a distribution network 250 and one or more FLO transmitters 260. The MediaFLO™ network 205 can be implemented to deliver real-time, non-real-time and IP data services content to one or more mobile devices, such as a MediaFLO™ device 280.

The MPS 210 provides one or more interfaces for an operator to configure the MediaFLO™ network 205. The MPS 210 distributes the MediaFLO™ network 205 configuration to the various systems, subsystems, and components included in the MediaFLO™ network 205. In some implementations, the MPS 210 can provide one or more web services programming interfaces. Web and software developers can generate custom web services applications through the web service programming interface. For example, a MediaFLO™ developer using the MPS 210 programming interface can generate and offer custom subscription packages to MediaFLO™ subscribers. In addition, the MPS 210 can share data and information, i.e., transmit to and receive from, with the MFMS 220, the MDS 230, and MTMS 240.

The MFMS 220 performs the operations, administration and maintenance functions for the MediaFLO™ network 205. Specifically, the MFMS 220 can monitor the systems constituting the MediaFLO™ service platform, i.e., the MPS 210, the MDS 230, and the MTMS 240. Components outside the MediaFLO™ service platform can be monitored by other systems, subsystems, or components. The MFMS 220 can provide management interfaces to enable network, state, fault, security, performance, and log management within the MediaFLO™ network 205. Network management can include discovering new networks and nodes to monitor, deleting monitored nodes, controlling MediaFLO™ agents and components, such as reset counters, restarting components, and terminating components. For example, the MFMS 220 network management interface can be used to communicate with and control the network management system 225. The network management system 225 can be implemented to manage the MediaFLO™ network 205 within, or external to, the MediaFLO™ network 205.

State management can include monitoring the high availability state of MediaFLO™ components, managing the administrative state of MediaFLO™ components, and monitoring the operational state of MediaFLO™ components. Fault management can include managing events, alarms and alarm maps, as well as performing fault recovery. For example, a network operator can clear one or more alarms using a client interface associated with the fault management server component of the MFMS 220. Security management can include controlling operator access to the element management system and fault management system. Performance and log management can include collecting statistics from MediaFLO™ components, providing threshold-based monitoring, and providing reports and graphical views for the Key Performance Indicators (KPI) generated from the statistics. KPIs can be derived from the statistics and can define and measure progress toward organizational goals. In addition, the MFMS 220 can share data and information with the MDS 230 and the MTMS 240.

The MDS 230 provides efficient distribution of encrypted content across one or more wireless networks. The wireless networks can include data optimized (DO) networks, DO-multicast networks, 3G or 4G networks and FLO networks. The MDS 230 can maintain responsibility for aggregation and distribution of real-time content, non-real-time content, IP data services content, subscription services management and FLO resource scheduling. Additionally, the MDS 230 can be implemented to perform configuration management for the MediaFLO™ network 205. The MDS 230 also can include one or more of the following subsystems: distribution; digital rights management (DRM); subscription, billing and service management; unicast request handling; and usage tracking.

The MDS 230 distribution subsystem interfaces with one or more content providers 235 to receive real-time, non-real-time, and IP data services content from the one or more content providers 235. The MDS 230 functions to provide a single user interface for streaming, Clipcast, and IP data services content. In some implementations, the MDS 230 distribution subsystem manages files, clips, and data content delivery. The distribution subsystem may also receive and consolidate program guide data from the content provider 235 and other sources, e.g., Tribune Media Services. The consolidated guide is termed a MediaFLO™ Program Guide (MPG) and can be implemented as an easy to use guide that contains program description and file delivery information associated with MediaFLO™ end users. The MDS 230 distributes the content, the MPG, and subscription information to one or more mobile devices using a FLO transmitter 260 or via a wireless provider 270.

The MDS 230 also can generate system information, such as overhead information, and can initiate distribution of the overhead information. In addition, the distribution subsystem can receive Clipcast content from content providers and can schedule clip delivery to mobile devices, such as a MediaFLO™ device 280, during contact windows. The distribution subsystem also can encrypt content for conditional access and apply forward-error-correction (FEC) encoding to improve reception probability at the MediaFLO™ device 280. Additionally, the distribution subsystem can be implemented to deliver content based on a network, or content provider, delivery schedule.

The MDS 230 DRM subsystem can distribute encryption keys to MediaFLO™ network 205 components. In addition, the DRM subsystem can securely distribute decryption keys to one or more MediaFLO™ devices 280. The DRM subsystem also can synchronize with one or more the third-party CAS 245. Third-party CAS 245 can provide protection of services on a per-user basis. For example, a third-party CAS 245 can blackout specific programs in certain regions, or restrict content available to a particular market.

The MDS 230 subscription, billing and service management (SBSM) subsystem can be implemented to make subscription-based billing predictable and readily understood. The SBSM subsystem can manage and provide MediaFLO™ content package subscriptions. For example, the SBSM subsystem can provide subscription services and a back-end billing interface 255 for the MediaFLO™ network 205. The back-end billing interface 255 can include billing and authentication information, in addition to authorization and accounting functions. Additionally, the SBSM subsystem can provide MediaFLO™ service management and can generate new and custom subscription packages. The SBSM subsystem can receive subscription information from one or more mobile devices. In some implementations, the SBSM subsystem can activate MediaFLO™ services for one or more subscribing mobile devices.

The MDS 230 unicast request handling subsystem can be implemented to manage functions related to unicast device-to-server interface protocols. The unicast request handling subsystem includes a unicast configuration server (UCS) and a usage tracking service request handler (UTSRH). The UCS can receive provisioned application upgrade information sent from the MPS 210. In some implementations, the MPS 210 maintains all application version information, whereas the UCS only maintains the latest application version information. The MediaFLO™ device 280 generally receives application upgrade notifications via, e.g., a multicast notification delivery path from the wireless provider 270. However, when the MediaFLO™ device 280 application version is out-of-date, the MediaFLO™ device 280 can perform an application upgrade check via a unicast connection to the UCS to obtain the latest version information. The UTSRH can collect service usage and performance statistics from MediaFLO™-enabled mobile devices. For example, the MediaFLO™ device 280 can be instructed to log usage events and upload the logged usage tracking statistics to the UTSRH. The UTSRH can collect the usage tracking statistics from the MediaFLO™ device 280 and can forward the usage tracking log to the usage tracking subsystem. In some implementations, usage tracking parameters can be transmitted to the MediaFLO™ device 280 as part of the notification flow. The MediaFLO™ device 280 can decide what events to log and when to log the usage tracking statistics based on the usage tracking parameters.

The MDS 230 usage tracking subsystem can receive the MediaFLO™ device's 280 upload data from the UTSRH and can log the data in persistent storage. In some implementations, the usage tracking subsystem can collect upload data directly from the one or more MediaFLO™-enabled mobile devices. The usage tracking subsystem can be implemented to share at least a portion of the usage tracking statistics with one or more third-party entities. In some implementations, the third-party entities can use the usage tracking statistics to measure MediaFLO™ users' service usage patterns. In addition, the MDS 230 can share data and information with the MTMS 240.

The MTMS 240 can be implemented to receive content from one or more content providers 235. The content can include real-time, non-real-time and IP data services content. The MTMS 240 can aggregate the received content and can change the content into a format supported by one or more mobile devices. In some implementations, the MTMS 240 can encode the content received from the one or more content providers 235. For example, real-time, non-real-time and IP data services content can be aggregated and transcoded at the MTMS 240 for delivery to the MediaFLO™ device 280. The MTMS 240 also can multiplex the received content before delivering encoded and multiplexed content to a distribution network 250. In some implementations, a multiplexer component of the MTMS 240 can aggregate the received content and alter the content into a MediaFLO™ supported format. Additionally, in some implementations, the multiplexer component can include a statistical multiplexer (Stat-MUX) that can be configured to change the bit rate of services according to the needs of different channels at different times. In statistical multiplexing, a communication channel can be divided into an arbitrary number of variable bit rate digital channels or data streams. The Stat-MUX can employ a more complex method of managing change in input channel bit rates, which can result in a better utilization of bandwidth. For example, using the Stat-MUX, a MediaFLO™ network 205 operator can decrease the bit rate for generally static channel programming, like a newscast, while increasing the bit rate for more dynamic channel programming, like a basketball game. The MTMS 240 also can be implemented to encrypt content, in addition to determining resource allocation and distribution of content. Moreover, the MTMS 240 can communicate with one or more third-party CAS 245. In addition, the MTMS 240 can transmit data and information through the distribution network 250 to the FLO transmitter 260.

The distribution network 250 can receive encoded content from the MTMS 240 and can distribute the content to the one or more FLO transmitters 260. The FLO transmitter 260 can receive encoded content from the MTMS 240 over the distribution network 250. The encoded content can include content belonging to a wide-area operational infrastructure (WOI) and a local-area operational infrastructure (LOI). Generally, the WOI content is associated with a wide-area broadcast signal that will be transmitted over a larger broadcast area than the LOI content, which is associated with a local-area broadcast signal. For example, the WOI content may be national news, and the LOI content may be regional or local news. The WOI and LOI content can be received by the FLO transmitter 260 in distinct WOI and LOI signals, or in one or more combined signals. The FLO transmitter 260 can be implemented to transmit the WOI content, the LOI content, or both, as a mobile broadcast signal to one or more mobile devices. The FLO transmitter 260 can supply the content to MediaFLO™-enabled mobile devices by transmitting a FLO waveform. For example, the FLO transmitter 260 can transmit a FLO waveform including the WOI and LOI content to the MediaFLO™ device 280.

In some implementations, the FLO transmitter 260 also can transmit content particular to a specific venue, or microvenue. The content particular to the specific venue or microvenue can be received from the MTMS 240 over the distribution network 250. Venues can include, e.g., sporting arenas, concert halls, movie theatres, shopping malls, or other such event locations. For example, the FLO transmitter 260 can transmit player statistics associated with a baseball game to MediaFLO™-enabled mobile devices residing within the confines, or surrounding area, of a baseball stadium. Microvenues can include, e.g., office buildings, automobiles or other mobile objects, restaurants, shopping mall department stores or kiosks, or other more localized event locations. For example, the FLO transmitter 260 can transmit sale-related data to users operating MediaFLO™-enabled mobile devices within the confines, or surrounding area, of a department store. Additional information related to venue and microvenue broadcasting can be found in U.S. patent application Ser. No. 12/569,792, filed Sep. 29, 2009, entitled "Apparatus and Methods of Providing and Receiving Venue Level Transmissions and Services," the entire contents of which are incorporated by reference herein.

The FLO transmitter 260 can include an exciter component and a transmitter component. The exciter component can receive ASI MPEG-2 transport streams and can perform proportional-integral-derivative (PID) filtering for the desired multiplex. The exciter component also can generate low power, e.g., less than 1-watt, FLO waveforms for the transmitter input. The transmitter component can generate RF signals that can be received over an air interface by one or more mobile devices. In some implementations, the transmitter can generate and transmit a FLO waveform using orthogonal frequency division multiplexing (OFDM). The transmitter also can be implemented to deliver RF signals to the MediaFLO™ device 280 via broadcast, multicast and unicast methodologies.

In some implementations, the MTMS 240, the distribution network 250 and the FLO transmitter 260 comprise the FLO RAN subsystem. The FLO RAN subsystem can receive real-time, non-real-time and IP data services content, and can perform audio and video encoding. The FLO RAN subsystem also can multiplex the received content and can distribute the multiplexed data streams. For example, the FLO RAN subsystem can receive real-time content, encode it, and multiplex it with other services, e.g., IP data services or DSvC, before encapsulating and distributing the content to FLO transmitters 260. Additionally, the FLO RAN subsystem can transmit one or more FLO waveforms to one or more mobile devices. For example, the FLO transmitter 260 of the FLO RAN subsystem can transmit one or more FLO signals to the MediaFLO™ device 280. The MediaFLO™ device 280 can be implemented to demodulate the FLO RF signal. Users operating the MediaFLO™ device 280 can navigate through each of the MediaFLO™ supported services and can access content received at the device. In addition, MediaFLO™ device 280 users can perform transaction-oriented operations with the MDS 230 over unicast connections through the wireless provider 270.

Conventional Concatenated Coding Structure

Figure 3:
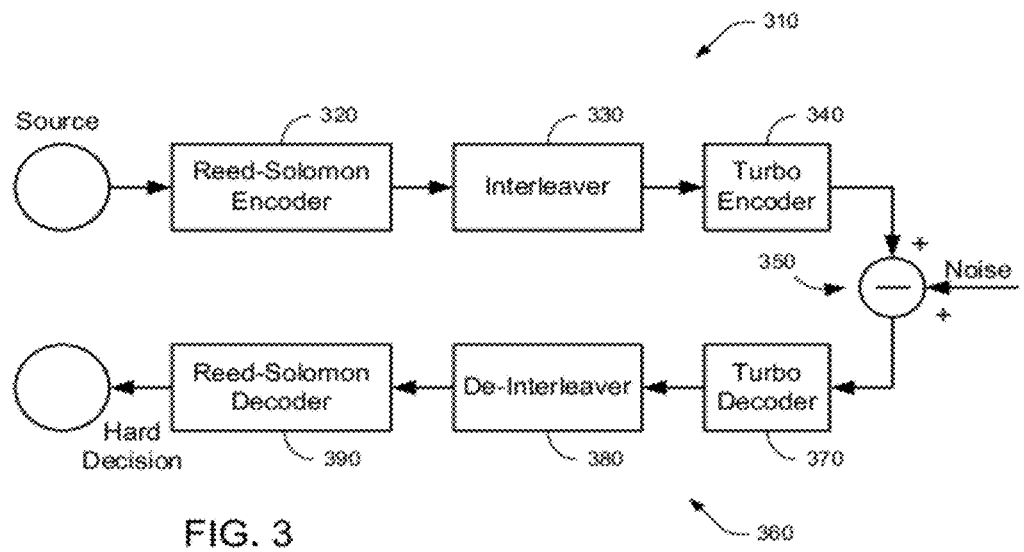
FIG. 3 diagrammatically illustrates a conventional coding/decoding scheme for use in a communication system.

FIG. 3 diagrammatically illustrates a conventional coding/decoding scheme for use in a communication system. The arrangement of FIG. 3 uses a concatenated coding structure with turbo coding for an inner code and Reed-Solomon coding for an outer code. At the transmitter, designated generally at 310, K data source packets are input to an outer Reed-Solomon encoder 320. As an example, for the MediaFLO™ broadcast system, the K data source packets are Media Access Control (MAC) layer source packets. The Reed-Solomon encoder 320 receives the block of K input packets and encodes parities to create (N−K) parity packets. The packets output by the Reed-Solomon encoder 320 are byte-level interleaved at an interleaver 330, and then encoded through an inner turbo encoder 340. The turbo encoded packets produced by the turbo encoder 340 are bit-level interleaved and modulated (not shown), and then transmitted through a noisy communication channel shown diagrammatically at 350. The receiver, designated generally at 360, implements the appropriate demodulation and bit-level de-interleaving (not shown), and includes a turbo decoder 370 that generates log likelihood ratios (LLRs) that respectively correspond to the turbo coded bits that arrive at the turbo decoder 370. The turbo decoder 370 updates the LLR values iteratively until a cyclic redundancy check (CRC) is satisfied or a maximum number of iterations is reached. Hard decisions regarding the bits of successfully decoded packets are de-interleaved at a de-interleaver 380. A Reed-Solomon erasure decoder 390 performs erasure decoding to recover the erased packets if possible. The decoded packets are then passed from the Reed-Solomon erasure decoder 390 to an upper layer (not shown). Descriptions of the type of coding/decoding scheme shown in FIG. 3 are provided by "Chari" and references therein.

If (N, K) is the dimension of the Reed-Solomon code being used at the symbol level (in bytes), then the Reed-Solomon code rate is $R_{RS}=K/N$. Some conventional systems support multiple code rates so, for example, K=8, 12, 14, or 15 can be used. For example, for the MediaFLO™ broadcast system, Reed-Solomon outer coding is specified for encoding rates $R_{RS}$ of ⅞, ¾, and ½ for N=16 byte-sized symbols.

Figure 4:
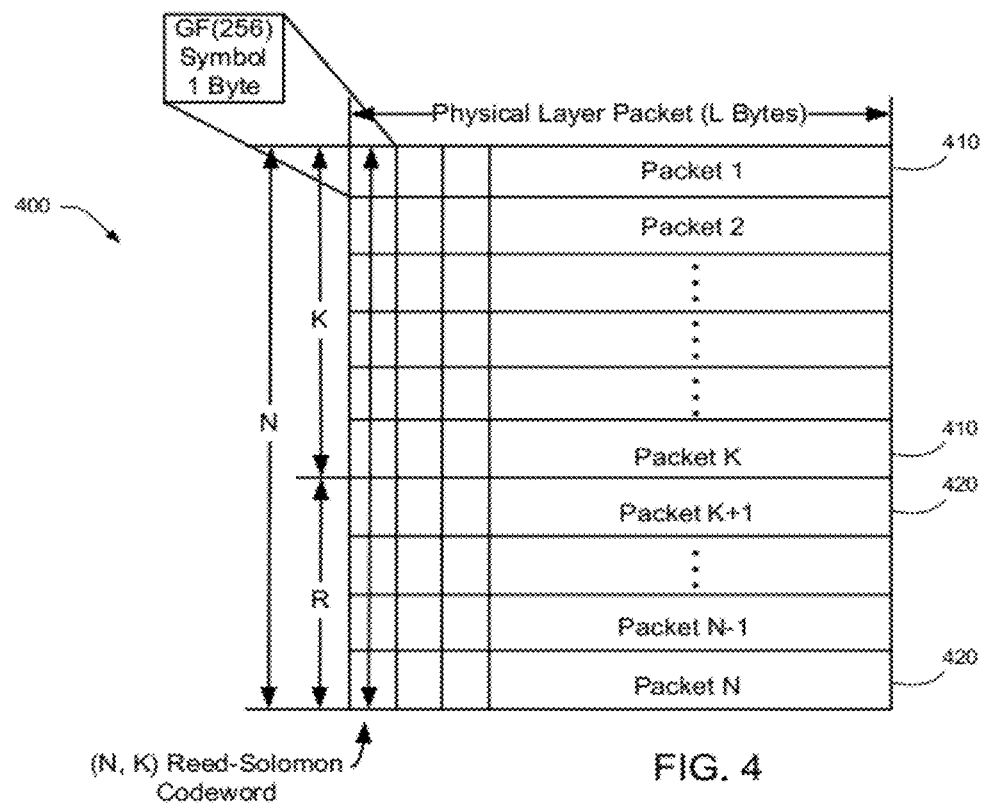
FIG. 4 illustrates a Reed-Solomon error control block structure.

The encoding operation of an (N, K) Reed-Solomon code in the aforementioned concatenated coding system (320 in FIG. 3) is illustrated in FIG. 4. Each row in the Reed-Solomon error control block 400 of FIG. 4 will form the payload for a physical layer packet, and each column contains one byte from each of the packets. The first K packets from the top can be systematic packets 410 from the source (see also FIG. 3). The Reed-Solomon encoder acts along each column of data, i.e., processes the K systematic bytes in a column and adds (N−K) parity bytes per column. Thus, for an (N, K) Reed-Solomon code, there would be the payload for N physical layer packets (i.e., corresponding to K systematic packets 410 and (N−K) parity packets 420) as a code block at the output of the Reed-Solomon encoder 320 of FIG. 3. The column-wise operation of the Reed-Solomon encoder 320 constitutes an implicit byte interleaving (e.g., the byte-level interleaving at the interleaver 330 in FIG. 3).

Referring again to FIG. 3, at the Reed-Solomon erasure decoder 390, the turbo-decoded physical layer packets belonging to one Reed-Solomon error control block 400 are first stored in a buffer. A CRC of each of the physical layer packets in the buffer is computed to determine whether the physical layer packet has been received correctly or not. If the CRC indicates an error, the entire packet is treated as an erasure. Each column of the Reed-Solomon error control block 400 is a Reed-Solomon codeword. On the other hand, each row is a single physical layer packet, which is received correctly or is determined to be an erasure. Thus, each Reed-Solomon codeword in the same Reed-Solomon error control block 400 contains the same number of erasures in exactly the same positions. An (N, K) Reed-Solomon code has a redundancy of (N−K) symbols, and is therefore able to correct any combination of (N−K) or fewer erasures within a codeword. However, if more than (N−K) physical layer packets in the Reed-Solomon error control block 400 are erased, the conventional concatenated coding structure of FIG. 3 does not attempt to recover the erased physical layer packets in erasure decoding.

Figure 5:
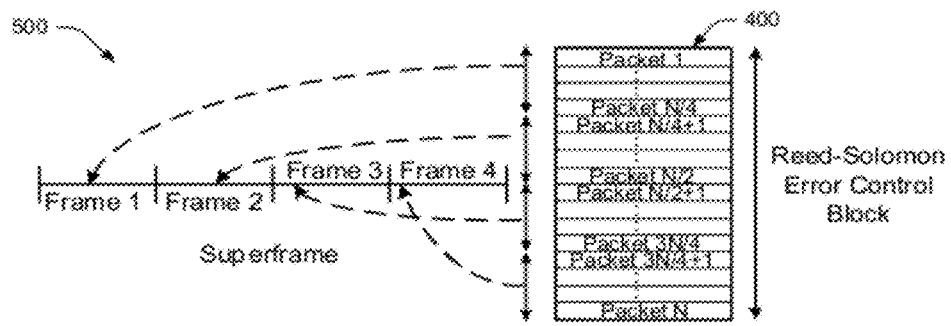
FIG. 5 illustrates a sequencing of packets of a Reed-Solomon error control block in a superframe.

FIG. 5 illustrates the sequencing 500 of packets of the Reed-Solomon error control block 400 of FIG. 4 in a superframe. The Reed-Solomon error control block 400 is split into four equal sub-blocks, and each sub-block is sent to the physical layer for transmission in a unique frame within a superframe. Each sub-block consists of a quarter of the rows in the Reed-Solomon error control block 400 (e.g., N/4 MAC layer packets). In MediaFLO™, when an MLC containing multiple Reed-Solomon error control blocks 400 needs to be transmitted in a superframe, a sub-block of size N/4 packets from each Reed-Solomon error control block 400 of the MLC is sent in each of the four frames in the superframe, with all of the sub-blocks assigned to a frame transmitted contiguously. Descriptions of the algorithm for sequencing of packets of Reed-Solomon error control blocks 400 in a superframe are provided by "Chari" and references therein.

Binary Image Expansion of Reed-Solomon Code

Reed-Solomon codes can be viewed as non-binary Bose-Chaudhuri and Hocquenghem (BCH) codes. Reed-Solomon codes can also be viewed as binary linear block codes. Consider an (N, K) Reed-Solomon code over $GF(2^m)$ with a parity check matrix $H_s$ of dimension (N−K)×N. It is known that all the $2^m$ elements in $GF(2^m)$ can be represented by an m-dimensional binary vector expansion in GF(2) using a basis which spans $GF(2^m)$. Addition operation in $GF(2^m)$ is simply the component-wise addition of the vectors over GF(2). Similarly, multiplication can be achieved by matrix multiplication. Each entry in the parity check matrix $H_s$ can be represented in the binary form using an m×m matrix over GF(2). Therefore, Reed-Solomon codes over $GF(2^m)$, which are used in many communication systems (e.g., MediaFLO™), can be represented using equivalent binary image expansions.

The length of an (N, K) Reed-Solomon codeword and the message at the bit-level is n=N×m and k=K×m, respectively. The parity check matrix $H_s$ has an equivalent binary image expansion $H_b$, where $H_b$ is an (n−k)×n binary parity check matrix. For example, a shortened (16, 12) Reed-Solomon code has an equivalent binary image form as a (128, 96) binary code and a binary parity check matrix $H_b$ of dimension 32×128. A shortened (16, 14) Reed-Solomon code has an equivalent binary image form as a (128, 112) binary code and a binary parity check matrix $H_b$ of dimension 16×128.

Iterative Decoding of Reed-Solomon Code

Due to the binary image form of Reed-Solomon codes over $GF(2^m)$, many decoding algorithms proposed for binary codes become directly applicable to Reed-Solomon codes over $GF(2^m)$. Bit-level soft decision decoding algorithms have been found to be efficient in decoding Reed-Solomon codes over $GF(2^m)$. In particular, iterative decoding schemes based on parity check matrix can be performed on a bipartite graph of a Reed-Solomon code. A bipartite graph is represented as two disjoint sets of nodes, variable nodes and check nodes. The variable nodes represent coded bits of the codeword, while the check nodes represent individual parity check constraints that coded bits need to satisfy. The variable nodes and the check nodes are connected via edges. Iterative decoding can be performed on a bipartite graph using soft values of coded bits as inputs. The bipartite graph structure of a binary linear block code is illustrated and further described in "Jiang."

Recall that the receiver 360 of the conventional concatenated coding structure of FIG. 3 includes a turbo decoder 370 that generates LLRs that respectively correspond to the turbo coded bits that arrive at the turbo decoder 370. Typically, hard decisions of these LLR values are input to the Reed-Solomon erasure decoder 390 to perform erasure decoding. In alternative bit-level soft decision decoding schemes, the LLR values are used as soft information available to the Reed-Solomon decoder. In particular, for the binary image form of the Reed-Solomon code, iterative decoding can be performed on the bipartite graph using the LLR values of coded bits as inputs to the variable node sites.

In typical low-density parity-check (LDPC) code decoding, belief propagation (BP) is used for variable node update, and the sum product algorithm (SPA) is used for check node update of a bipartite graph. The Reed-Solomon codes used in MediaFLO™ do not possess sparse parity check matrices, making a low complexity implementation preferable. In this case, belief accumulation (BA) can be used for variable node update, and the min-sum algorithm (MSA) can be used for check node update of the bipartite graph. The approximation of the variable node and check node updates of BA and MSA utilizes less memory than BP and SPA and facilitates hardware implementation. These techniques for updating nodes of bipartite graphs are further described in "Jiang."

Parity check matrix based iterative decoding is suboptimal for codes associated with dense parity check matrices, e.g., Reed-Solomon codes. Decoding performance largely depends on the selected parity check matrix regardless of the type of iterative decoding used. Thus, selective generation of sparser parity check matrices can improve decoding performance of linear block codes. Further improvements in decoding can be achieved by optimizing selection of parity check matrices to match erasure patterns in received codewords of the linear block codes. In the following sections, techniques are described for generating and selecting parity check matrices for improved decoding performance.

Generation of a Parity Check Matrix

The following techniques for generating and selecting parity check matrices are described for the MediaFLO™ broadcast system, although the techniques are generally applicable to other content delivery services. Furthermore, in this disclosure, Reed-Solomon codes are generally considered for the outer code in concatenated coding schemes for content delivery services, although other types of codes, e.g., chain-reaction codes, can be used in the alternative. Chain reaction codes, including Luby Transform (LT™) chain reaction codes and Raptor™ multi-stage chain reaction ("MSCR") codes, provide excellent recovery of lost packets, and are highly adaptable to varying channel conditions.

Figure 6:
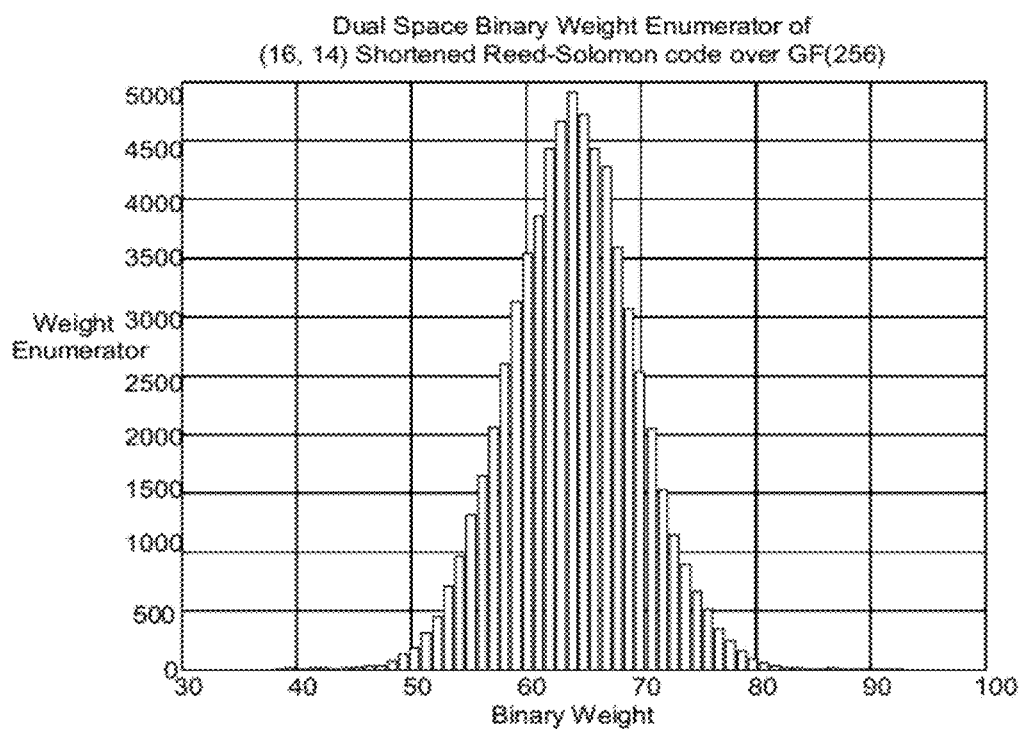
FIG. 6 illustrates a weight enumerator of possible parity checks for a (16, 14) shortened Reed-Solomon code over GF(256).

The parity check matrix of a particular code is not unique. For example, a parity check matrix of a Reed-Solomon code can take one of many forms, such as a standard form, a systematic form, a cyclic form, etc. In fact, there are $2^{(N-K)m}$ binary parity checks in the dual space of an (N, K) Reed-Solomon code over $GF(2^m)$, and the number of possible parity check matrices is even greater. Nevertheless, not all the parity checks are of equal weight. FIG. 6 illustrates the weight enumerator of all possible parity checks for the (16, 14) shortened Reed-Solomon code over GF(256) used in MediaFLO™.

The selection of a parity check matrix has a significant impact on the performance of iterative decoding and its variations, as discussed above. Some techniques for optimizing parity check matrices are known in the art. These techniques are based on several principles: (A) low-weight parity checks are preferable; (B) a parity check matrix with few or zero short cycles in its bipartite graph is preferable; and (C) a variable node of low degree is typically weakly protected. In general, principles (A) and (B) are related; that is, a sparser parity check matrix usually leads to fewer cycles and vice versa.

The following techniques for generating parity check matrices generally involve searching for a set of lowest weight parity check vectors and constructing a parity check matrix using the lowest weight parity check vectors of the set. In general, searching for a set of minimum or low weight parity check vectors is a nondeterministic polynomial time (NP) problem. However, for the (16, 14) and (16, 12) shortened Reed-Solomon codes used in MediaFLO™, the set of minimum weight parity check vectors can be found by exhaustive search in a reasonable amount of time. The (16, 14) shortened Reed-Solomon code has $2^{(16-14)8}$=65,536 binary parity checks, while the (16, 12) shortened Reed-Solomon code has $2^{(16-12)8}$≈4 billion parity checks.

A parity check matrix for a particular code can be generated based on one or more criteria for selecting parity check vectors for the parity check matrix. Examples of criteria include (1) low or minimum weight; (2) a regular degree profile; (3) an irregular degree profile; and (4) few length-4 cycles, where a length-4 cycle occurs if two parity check vectors have two variable bits in common. Other criteria are possible.

For criterion (1), the set of parity check vectors of minimum weight can be determined directly from an exhaustive search. If an exhaustive search for the minimum weight parity check vectors is not feasible, the set of parity check vectors of low weight can be determined via some greedy algorithms. For criterion (2), some form of greedy algorithm can be used to select the parity check vectors to construct the matrix, such that the constructed parity check matrix has a near regular variable degree distribution. For criterion (3), the parity check matrix can be constructed to match some irregular profile that is known to result in good decoding performance. Some irregular bipartite graphs with chosen degree patterns are described in "Design of Capacity-Approaching Irregular Low-Density Parity-Check Codes," IEEE Trans. Inform. Theory, vol. 47, no. 2, pp. 619-637, February 2001, by T. J. Richardson, M. A. Shokrollahi, and R. L. Urbanke. Regarding criterion (4), parity check matrices for Reed-Solomon codes are usually dense, and their bipartite graphs are usually of girth-4, i.e., the shortest cycle length of the bipartite graphs is 4. A length-4 cycle occurs if two parity check vectors have two variable bits in common. Thus, the overlap between two parity check vectors indicates the majority of length-4 cycles.

Process of Generating a Parity Check Matrix for Iterative Decoding

Figure 7:
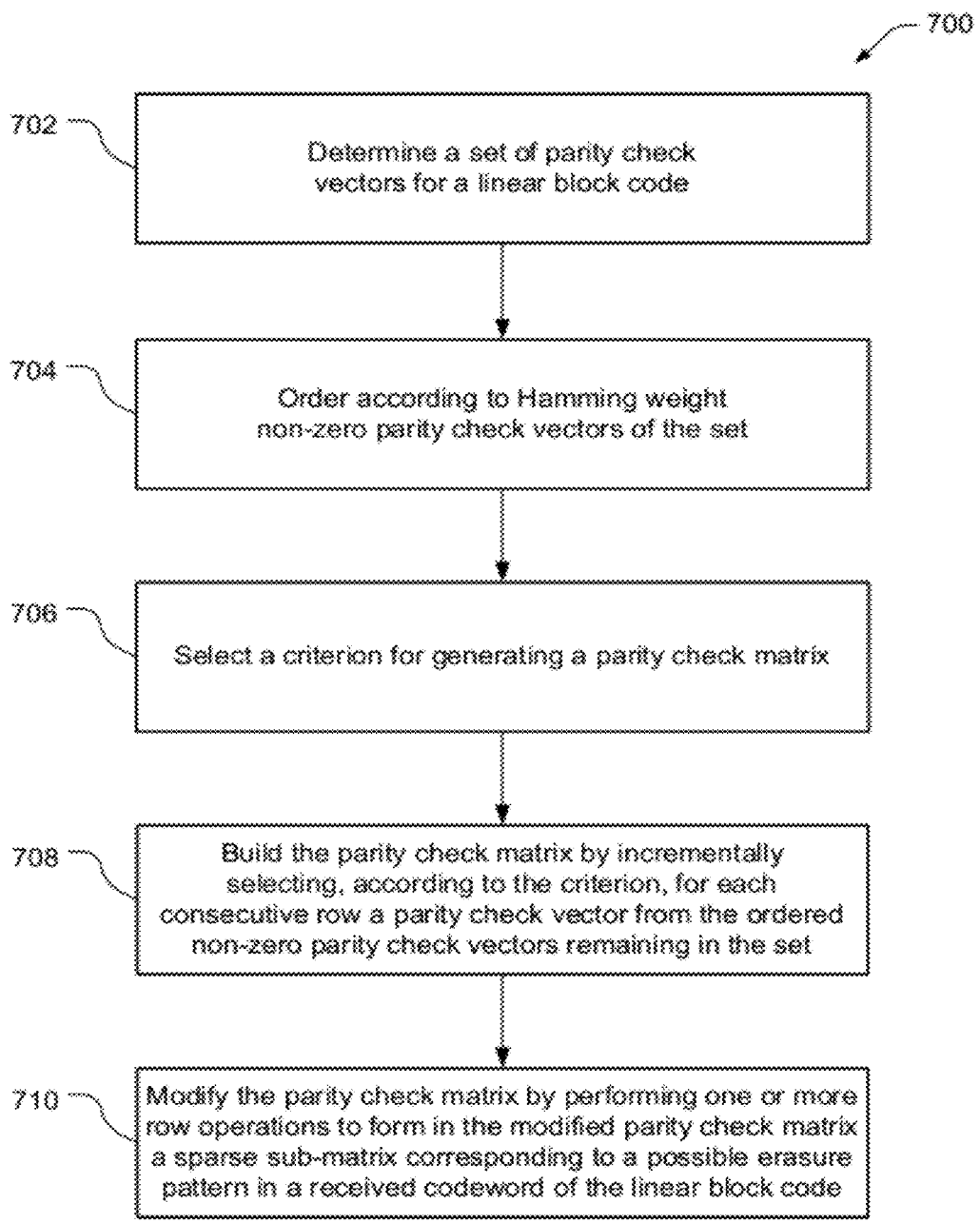
FIG. 7 is a block flow diagram of a process of generating a parity check matrix for iterative decoding.

Referring to FIG. 7, a process 700 of generating a parity check matrix for iterative decoding of a linear block code includes the stages shown. The process 700 is exemplary only and not limiting. The process 700 can be altered, e.g., by having stages added, removed, or rearranged.

At stage 702, a processor (e.g., a processor of a server of a communication system) determines a set of parity check vectors (i.e., parity check constraints) for the linear block code. For example, the linear block code can be the binary image expansion of a Reed-Solomon code, such as a shorted Reed-Solomon code over GF(256) used in the MediaFLO™ broadcast system. In some implementations, the complete set of all unique parity check vectors is determined for the linear block code. This is feasible for the (16, 14) and (16, 12) shortened Reed-Solomon codes used in MediaFLO™. In other implementations, only a subset of the set of unique parity check vectors is determined for the linear block code.

At stage 704, the processor orders, according to Hamming weight, the non-zero parity check vectors of the set determined at stage 702. The parity check vectors can be ordered using a greedy algorithm as follows. For the set of parity check vectors, define H(i) as the $i^{th}$ parity check vector of the set. M non-zero parity check vectors in the set are ordered according to their Hamming weights. That is, if W(H(i)) denotes the Hamming weight of the $i^{th}$ parity check vector HO for 0≦i<M, W(H(i))≦W(H(j)), for i<j.

At stage 706, the processor selects a criterion for generating the parity check matrix. In some implementations, the criterion is one of minimum weight, low weight, a regular degree profile, an irregular degree profile, and few length-4 cycles. In some implementations, several criterions can be selected and prioritized, such that the parity check matrix is generated by combining, in hierarchy, the optimization step of each individual criterion.

At stage 708, the processor builds the parity check matrix by incrementally selecting, according to the criterion, a parity check vector for each consecutive row of the parity check matrix. The parity check vector is selected from the ordered non-zero parity check vectors remaining in the set. As an example, for an (N, K) Reed-Solomon code with an (n, k) binary image expansion, n-k parity check vectors J(i) for 0≦i<(n-k) are incrementally selected out of the M ordered non-zero parity check vectors, based on the criterion selected at stage 706. Starting from the $0^{th}$ parity check vector, a new parity check vector is added that differs from the previously selected parity check vectors and that optimizes a metric associated with the selected criterion. For the example criteria listed above, further description of the incremental selection of the parity check vectors and the metric optimization is provided below.

At stage 710, the processor can modify the parity check matrix by performing one or more row operations on the parity check matrix to form, in the modified parity check matrix, a sparse sub-matrix corresponding to a possible erasure pattern in a received codeword of the linear block code. Further description of sparse sub-matrices and possible erasure patterns is provided below.

In some implementations, the criterion selected at stage 706 is a parity check matrix having a minimum weight. For this criterion, building the parity check matrix at stage 708 includes incrementally selecting the next ordered non-zero parity check vector remaining in the set for each consecutive row of the parity check matrix. That is, the first n-k ordered non-zero parity check vectors are selected from the set as J(i) for 0≦i<(n-k), respectively, to form the parity check matrix.

Alternatively, the criterion selected at stage 706 can be a parity check matrix having a low weight. For this criterion, building the parity check matrix at stage 708 includes incrementally selecting a parity check vector with a Hamming weight less than or equal to a threshold weight for each consecutive row of the parity check matrix. That is, for a maximum threshold weight of $W_{max}$, n-k ordered non-zero parity check vectors are selected from the set as J(i) such that W(J(i))≦$W_{max}$ for 0≦i<(n-k).

In other implementations, the criterion selected at stage 706 is a parity check matrix having a regular degree profile. For this criterion, building the parity check matrix at stage 708 includes incrementally selecting a parity check vector that minimizes column weight variance of the parity check matrix being built. A respective parity check vector is selected for each consecutive row of the parity check matrix and is selected from the ordered non-zero parity check vectors remaining in the set.

For the criterion of a regular degree profile, parity check vectors can be incrementally selected to minimize column weight variance as follows. First, at the $0^{th}$ iteration, the first ordered non-zero parity check vector H(0) is selected. At the $i^{th}$ iteration, the parity check vectors J(0), ..., J(i−1) have already been selected for the parity check matrix being built. The next parity check vector, J(i), is selected from a set R of remaining ordered non-zero parity check vectors H(j) to achieve the lowest column weight variance. That is, $$J(i) = \arg\min_{H(j) \in R} \left( \text{var}\left( \sum_{l=0}^{i-1} J(l) + H(j) \right) \right).$$

In yet other implementations, the criterion selected at stage 706 is a parity check matrix having an irregular degree profile. For this criterion, building the parity check matrix at stage 708 includes incrementally selecting a parity check vector that minimizes the square error between an interpolated column weight cumulative distribution function (CDF) of the parity check matrix being built and a target column weight CDF having the irregular degree profile. A respective parity check vector is selected for each consecutive row of the parity check matrix and is selected from the ordered non-zero parity check vectors remaining in the set.

For the criterion of an irregular degree profile, parity check vectors can be incrementally selected to minimize the square error between the two CDFs as follows. At the $i^{th}$ iteration, for the dimension-(n−k) vector C that is the target column weight CDF having the irregular degree profile, the next parity check vector, J(i), is selected from the set R of remaining ordered non-zero parity check vectors H(j) as $$J(i) = \arg\min_{H(j) \in R} \left( \left\| \underset{i \to n-k}{interp}\left( cdf\left( \sum_{l=0}^{i-1} J(l) + H(j) \right) \right) - C \right\| \right),$$

where n−k is the maximum possible degree of a variable node of the parity check matrix, and $\|\cdot\|$ denotes the L2-norm. Interpolation is performed to produce (n−k) points from i points, where interpolation can be performed using known interpolation techniques.

In still other implementations, the criterion selected at stage 706 is a parity check matrix having few length-4 cycles. For this criterion, building the parity check matrix at stage 708 includes incrementally selecting a parity check vector that minimizes the maximum inner product between previously selected parity check vectors of the parity check matrix being built and a candidate parity check vector considered for selection. A respective parity check vector is selected for each consecutive row of the parity check matrix and is selected from the ordered non-zero parity check vectors remaining in the set.

For the criterion of few length-4 cycles, parity check vectors can be incrementally selected to minimize the maximum inner product by finding the parity check vector in the set R of remaining ordered non-zero parity check vectors H(j) that minimizes the maximum inner product with any of the parity check vectors J(0), ..., J(i−1) that have already been selected for the parity check matrix being built. That is, $$J(i) = \arg\min_{H(j) \in R} \left( \max_l \langle H(j), J(l) \rangle \right),$$

where <·> denotes the inner product, and l is 0 to (i−1). Selecting J(i) using this metric minimizes the overlap between parity check vectors selected for the parity check matrix being built, and thus reduces the number of length-4 cycles between pairs of parity check vectors of the matrix.

In some implementations, the process 700 includes adding redundant rows to the parity check matrix. In some scenarios, a redundant parity check matrix can provide improved decoding performance over a parity check matrix having full rank. For example, principle (C) listed above can be addressed by a redundant parity check matrix, because the additional redundant rows can increase the degree of an otherwise low degree variable node that might be weakly protected.

Optimization of Parity Check Matrices and Selection of an Optimized Parity Check Matrix The techniques for generating a parity check matrix described in the previous section are applicable to iterative decoding in general. Further improvements in decoding can be achieved by optimizing selection of parity check matrices to account for the particular frame structure used for transmitting the coded data. This can be achieved by first generating a set of parity check matrices that are optimized to match possible erasure patterns in received codewords of the linear block code, where the possible erasure patterns result, in part, from the particular frame structure used. Decoding at the receiver can then be adapted by determining the erasure pattern of a present received codeword and selecting for use in iterative decoding one of the parity check matrices from the set of optimized matrices to match the determined erasure pattern.

The following techniques for optimizing parity check matrices and selecting optimized parity check matrices are described for the MediaFLO™ broadcast system, although the techniques are generally applicable to other content delivery services. Furthermore, the techniques are generally considered for Reed-Solomon codes, although they also apply to other types of codes.

In MediaFLO™, packets of a Reed-Solomon error control block (i.e., Reed-Solomon error control block 400 of FIG. 4) are sequenced in a superframe as illustrated in FIG. 5. The Reed-Solomon error control block 400 is split into four equal sub-blocks, and each sub-block is sent to the physical layer for transmission in one of the four frames within the superframe. Each sub-block consists of a quarter of the rows in the Reed-Solomon error control block 400 (e.g., N/4 MAC layer packets).

For the (16, 14) and (16, 12) shortened Reed-Solomon codes used in MediaFLO™, the N=16 packets of the Reed-Solomon error control block 400 are interleaved in the four frames of the superframe in order to capture time diversity. As illustrated in FIG. 4, the $i^{th}$ packet contains the $i^{th}$ coded symbol (i.e., byte) of each Reed-Solomon codeword in the Reed-Solomon error control block 400. Thus, Frame 1 of the superframe contains the first four coded symbols (i.e., bytes 0-3) of each Reed-Solomon codeword in the Reed-Solomon error control block 400, Frame 2 contains the second four coded symbols (i.e., bytes 4-7), Frame 3 contains the third four coded symbols (i.e., bytes 8-11), and Frame 4 contains the last four coded symbols (i.e., bytes 12-15). Additionally, when an MLC containing multiple Reed-Solomon error control blocks 400 needs to be transmitted in a superframe, the four packets of a particular Reed-Solomon error control block 400 are also interleaved across the multiple Reed-Solomon error control blocks 400 in that MLC.

Because of the frame structure used for transmitting the coded data in the MediaFLO™ broadcast system, as illustrated in FIG. 5, the four packets of a particular Reed-Solomon error control block 400 in each frame experience more correlated fading than the fading experienced by packets across frames of the superframe. Furthermore, simulations of MediaFLO™ data transmission in fading channels suggest that all four packets in the same frame of a superframe tend to fail inner decoding (e.g., turbo decoding) simultaneously, especially in the cases where the mobile device 140 is moving at low speeds.

The knowledge that packets, and correspondingly, coded symbols, tend to fail inner decoding together as grouped by a frame can be used to generate a set of parity check matrices optimized to match possible erasure patterns in received codewords of the outer code, here a Reed-Solomon code for MediaFLO™. Thus, for the set of known possible erasure patterns, it is preferable to select parity check matrices that are locally sparse over a parity check matrix that is globally sparse. In particular, for a given erasure pattern, it is preferable to select an optimized parity check matrix that includes one or more sparse sub-matrices corresponding to the undecodable symbols of the given erasure pattern. Such an optimized parity check matrix is strictly sparser than the globally sparse parity check matrix in the portion of the corresponding bipartite graph where iterative decoding will be performed.

Therefore, given a set of known possible erasure patterns, a set of parity check matrices can be pre-optimized such that each pre-optimized parity check matrix is sparse in one or more sectors. At the receiver, the Reed-Solomon decoder can select, in real time, one of the pre-optimized parity check matrices of the set that matches the erasure pattern of the received codeword.

Figures 8, 9:
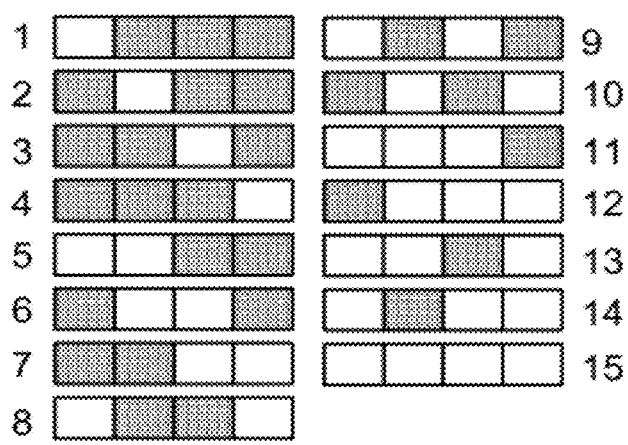
FIG. 8 illustrates a parity check matrix with a sparse sub-matrix for iterative decoding.
FIG. 9 illustrates possible sparseness patterns for parity check matrices.

FIG. 8 illustrates an example of a parity check matrix with a sparse sub-matrix for iterative decoding. The sub-matrix 810 is sparser than the remaining sectors (i.e., the shaded sectors 820) of the parity check matrix $H_b$. Sparseness is determined by row weight (i.e., check node degree).

The set of pre-optimized parity check matrices can be generated using the techniques described above in the previous section. In particular, individual parity check matrices can be generated using process 700, where an individual generated parity check matrix is optimized at stage 710 by performing one or more row operations to form one or more sparse sub-matrices in the modified parity check matrix, such that the sparse sub-matrices match a particular erasure pattern in the set of known possible erasure patterns.

As described above, in MediaFLO™, the coded symbols within each frame experience more correlated fading and tend to fail inner decoding together, due in part to the frame structure and the interleaving of the data. As a result, the symbols in a frame can be grouped together as a sector, where each codeword has four sectors (i.e., one for each frame in which symbols of the codeword are transmitted). Generally, with s sectors, each with or without erasures of the included symbols, there are $2^s-1$ erasure patterns, not including the case where there are zero erasures. In the case of MediaFLO™, there are s=4 sectors in a codeword and $2^4-1=15$ known possible erasure patterns.

FIG. 9 illustrates the 15 possible sectorized erasure patterns for optimizing the parity check matrices for MediaFLO™. In the sectorized erasure patterns, the unshaded sections correspond to the sparse sub-matrices, while the shaded sections correspond to the denser sub-matrices. The fifteenth erasure pattern corresponds to the case when erasures occur in all four sections of the codeword (i.e., in all four frames of the superframe). A parity check matrix does not need to be optimized for the case when zero erasures occur in the codeword, because iterative decoding of the Reed-Solomon code is unnecessary in that case. Further, because iterative decoding of the Reed-Solomon code will only be performed on the sparse sub-matrices, corresponding to the sectors of the codeword with erasures, only the sparse sub-matrices need to be stored at the receiver for iterative decoding of the outer code. Moreover, due to the cyclic structure of Reed-Solomon codes, some of the sparse sub-matrices of the set of optimized parity check matrices may be identical, further reducing the storage needed at the receiver.

As noted above, the techniques of this section have been described with reference to Reed-Solomon codes as the outer code in a concatenated coding scheme used in MediaFLO™ with the framing structure of FIG. 5. However, the techniques are also generally applicable to other types of codes, other communications systems, and/or other framing structures.

Process of Decoding Data Transmitted on a Communication Link

Figure 10:
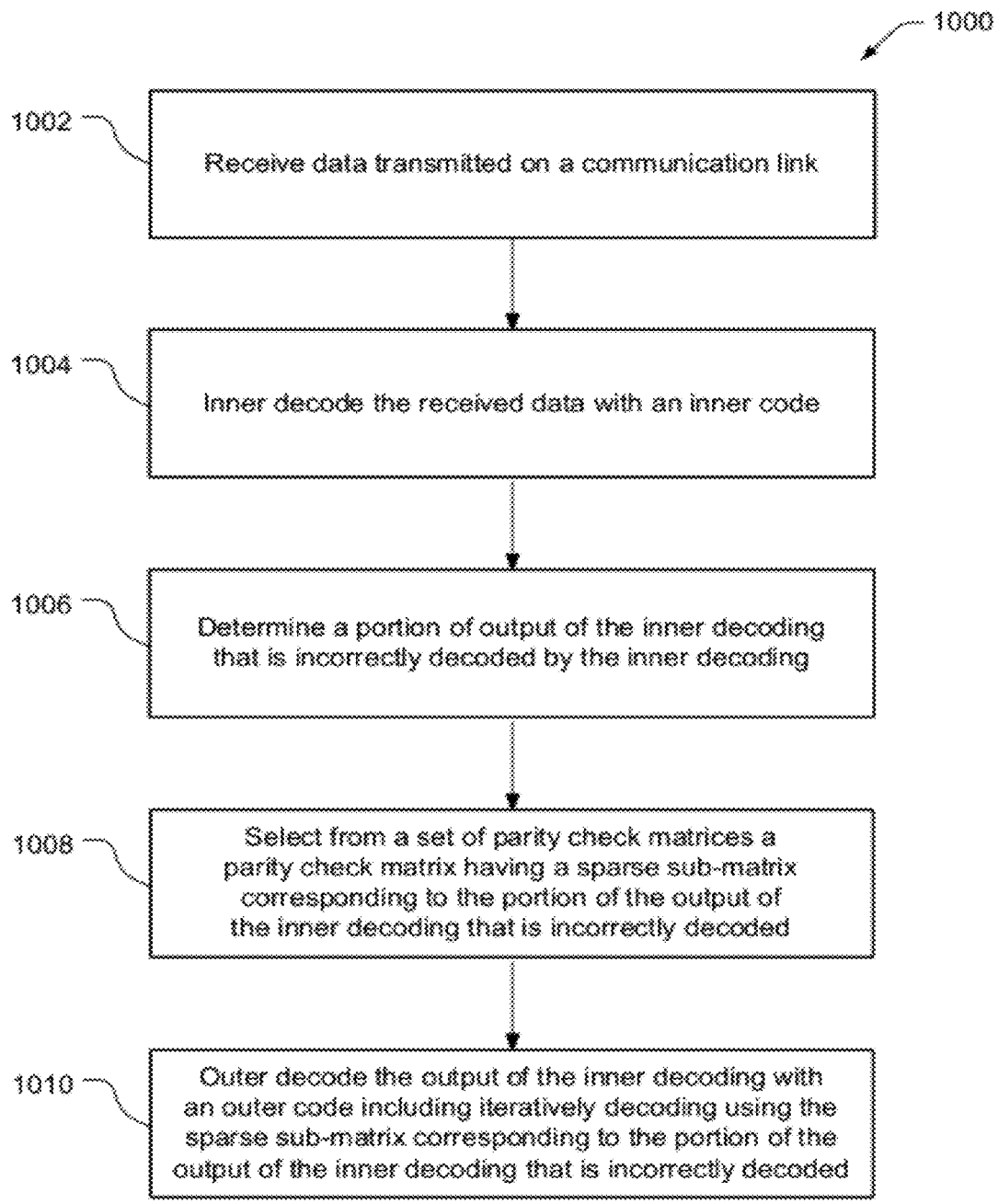
FIG. 10 is a block flow diagram of a process of decoding data transmitted on a communication link.

Referring to FIG. 10, a process 1000 of decoding data transmitted on a communication link includes the stages shown. The process 1000 is exemplary only and not limiting. The process 1000 can be altered, e.g., by having stages added, removed, or rearranged.

At stage 1002, a receiver (e.g., a receiver of a mobile device 140) receives data transmitted on the communication link. The communication link can be part of a content delivery system, e.g., the MediaFLO™ broadcast system. The data transmitted on the communication link can represent content to be communicated to a receiving device, where the content includes at least one of video media, audio media, or textual media.

At stage 1004, an inner decoder (e.g., an inner decoder of the mobile device 140) inner decodes the received data with an inner code. For example, the received data can be decoded with a turbo decoder. In other examples, the inner code is a LDPC code or a convolutional code.

At stage 1006, a processor (e.g., a processor of the mobile device 140) determines a portion of output of the inner decoding that is incorrectly decoded by the inner decoding. In some implementations, determining the portion includes calculating a CRC using the output of the inner decoding. For example, if the inner decoding of stage 1004 is performed by a turbo decoder, hard decisions can be made on the LLR values output from the turbo decoder and fed into a CRC block to determine whether the physical layer packet, and the corresponding symbol of an outer codeword, was correctly decoded or incorrectly decoded. If incorrectly decoded, the physical layer packet and the corresponding symbol will be treated as an erasure. This can be repeated to determine all the symbol erasures in the outer codeword.

At stage 1008, the processor selects, for iterative decoding, a parity check matrix from a set of parity check matrices, where the selected parity check matrix has a sparse sub-matrix corresponding to the portion of the output of the inner decoding that is incorrectly decoded. In some implementations, the parity check matrices of the set are generated using one or more of the following criteria: minimum weight, low weight, a regular degree profile, an irregular degree profile, and few length-4 cycles. Each parity check matrix of the set can be generated to match a respective possible erasure pattern in a received codeword of the outer code.

As in example, if the communication link is part of the MediaFLO™ broadcast system, and the portion determined as incorrectly decoded at stage 1006 corresponds to erasures in the first eight symbols of the Reed-Solomon codeword (i.e., in the first two frames of the superframe), a pre-optimized parity check matrix matching the fifth sectorized erasure pattern of FIG. 9 can be selected for iterative decoding. In some implementations, selection includes retrieving from storage the sparse sub-matrices of the selected pre-optimized parity check matrix. In the given example, two sparse sub-matrices would be retrieved.

At stage 1010, an outer decoder (e.g., an outer decoder of the mobile device 140) outer decodes the output of the inner decoding with the outer code, including iteratively decoding using the sparse sub-matrix corresponding to the portion of the output of the inner decoding that is incorrectly decoded. In some implementations, the iterative decoding uses one or more of belief propagation, the sum product algorithm, belief accumulation, and the min-sum algorithm. In some implementations, the iterative decoding is performed by hardware.

Continuing the above example, the Reed-Solomon codeword symbols that were correctly decoded by the inner decoder (e.g., as indicated by the CRC of the corresponding physical layer packet and corresponding to the denser sub-matrices of the selected pre-optimized parity check matrix) can be treated as known symbols. The contribution of these known symbols to the check node sites of the bipartite graph for the Reed-Solomon code can be computed. Thus, the order of the parity check constraints is reduced to include just the variable node sites corresponding to the unknown (i.e., erased) codeword symbols. As a result, iterative decoding of the Reed-Solomon codeword is only performed on the sparse sub-matrices of the selected pre-optimized parity check matrix.

In some implementations, the process 1000 repeats from stages 1004 through 1010 for one or more iterations through the concatenated coding scheme. In particular, with repeated iterations at stage 1004, the inner decoder can inner decode the output of the outer decoding from the last iteration at stage 1010. For example, soft output of a Reed-Solomon outer code can be used as soft information available to a turbo code inner decoder. The iterations between the inner and outer decoding can continue, for example, until a target decoding performance is reached, a maximum number of iterations is reached, or the earlier of the two. Iterative turbo-Reed-Solomon decoding with Reed-Solomon SISO is described in "Jiang."

Figure 11:
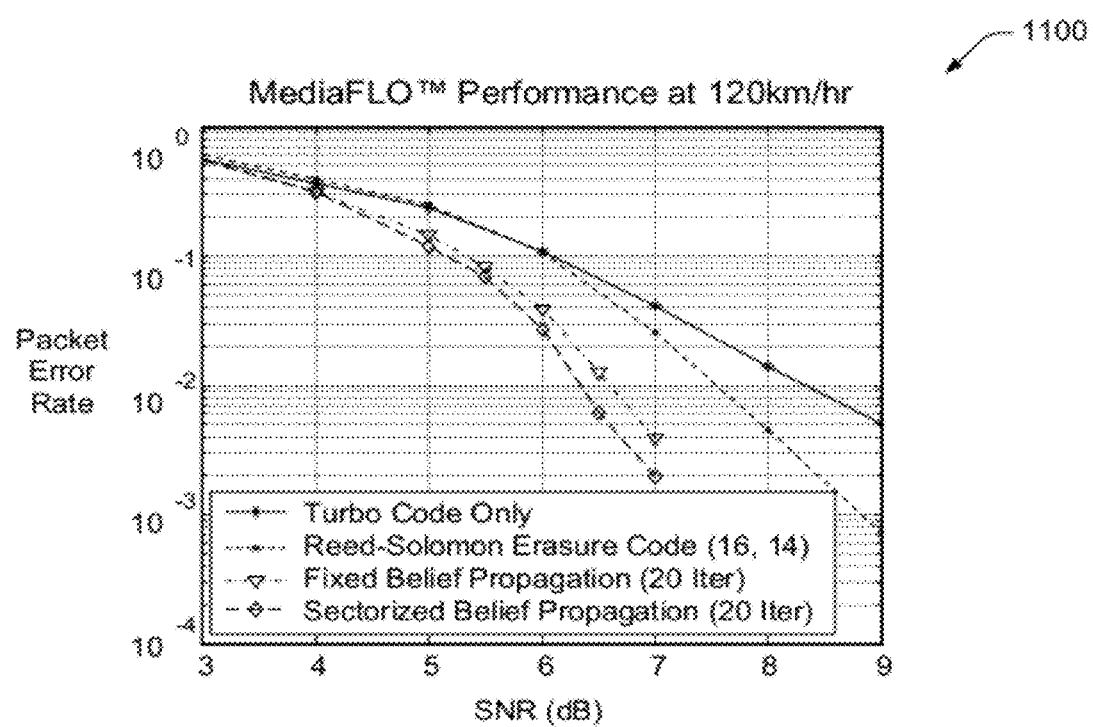
FIG. 11 is a chart of simulation results comparing decoding performance for the MediaFLO™ system.

Referring to FIG. 11, a chart 1100 of simulation results compares decoding performance for the MediaFLO™ system. The chart 1100 shows simulation results for performance of MediaFLO™ transmit mode 1 modeled over a Pedestrian B profile at 120 km/hr. Descriptions of the transmit modes and simulation models for the MediaFLO™ system are further described in "Chari." Simulation results are shown for the case of turbo decoding only (i.e., no Reed-Solomon outer code), conventional concatenated decoding of turbo code and Reed-Solomon erasure code, iterative turbo-Reed-Solomon SISO decoding for 20 iterations using belief propagation with a fixed parity check matrix, and iterative turbo-Reed-Solomon SISO decoding for 20 iterations using belief propagation with selection of sectorized parity check matrices (i.e., parity check matrices optimized to include sparse sub-matrices). At a packet error rate of $10^{-2}$, decoding with the selected optimized parity check matrices provides about 0.2-0.3 dB gain in the Signal-to-Noise Ratio (SNR) relative to decoding with a fixed parity check matrix.

Considerations Regarding the Description

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), a digital signal processing device (DSPD), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The blocks of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software executed by a processor, firmware, or any combination thereof. If implemented in software executed by a processor, the functions may be stored on or transmitted over as one or more instructions or code on a computer-readable medium. Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of computer-readable media.

The previous description is provided to enable any person skilled in the art to make and/or use the apparatus, systems, and methods described. Various modifications to the disclosure will be readily apparent to those skilled in the art, and the generic principles defined herein may be applied to other variations without departing from the spirit or scope of the disclosure. Thus, the disclosure is not to be limited to the examples and designs described herein but is to be accorded the widest scope consistent with the principles and novel features disclosed herein.

What is claimed is:

1. A method of generating a parity check matrix for iterative decoding of a linear block code, the method comprising:
   determining, by a processor, a set of parity check vectors for the linear block code;
   ordering, by the processor, according to Hamming weight non-zero parity check vectors of the set;
   selecting, by the processor, a criterion for generating the parity check matrix;
   building, by the processor, the parity check matrix by incrementally selecting according to the criterion a parity check vector for each consecutive row of the parity check matrix, the parity check vector selected from the ordered non-zero parity check vectors remaining in the set; and
   modifying, by the processor, the parity check matrix by performing one or more row operations to form in the modified parity check matrix a sparse sub-matrix corresponding to a possible erasure pattern in a received codeword of the linear block code.

2. The method of claim 1, wherein determining the set of parity check vectors comprises determining the set of all unique parity check vectors for the linear block code.

3. The method of claim 1, wherein
   the criterion is a parity check matrix having a minimum weight; and
   building the parity check matrix comprises incrementally selecting a next ordered non-zero parity check vector remaining in the set for each consecutive row of the parity check matrix.

4. The method of claim 1, wherein
   the criterion is a parity check matrix having a low weight; and
   building the parity check matrix comprises incrementally selecting a parity check vector with a Hamming weight less than or equal to a threshold weight for each consecutive row of the parity check matrix, the parity check vector selected from the ordered non-zero parity check vectors remaining in the set.

5. The method of claim 1, wherein
   the criterion is a parity check matrix having a regular degree profile; and
   building the parity check matrix comprises incrementally selecting a parity check vector that minimizes column weight variance of the parity check matrix being built, the parity check vector selected for each consecutive row of the parity check matrix, the parity check vector selected from the ordered non-zero parity check vectors remaining in the set.

6. The method of claim 1, wherein
   the criterion is a parity check matrix having an irregular degree profile; and
   building the parity check matrix comprises incrementally selecting a parity check vector that minimizes square error between an interpolated column weight cumulative distribution function of the parity check matrix being built and a target column weight cumulative distribution function having the irregular degree profile, the parity check vector selected for each consecutive row of the parity check matrix, the parity check vector selected from the ordered non-zero parity check vectors remaining in the set.

7. The method of claim 1, wherein
   the criterion is a parity check matrix having few length-4 cycles; and
   building the parity check matrix comprises incrementally selecting a parity check vector that minimizes a maximum inner product between previously selected parity check vectors of the parity check matrix being built and a candidate parity check vector considered for selection, the parity check vector selected for each consecutive row of the parity check matrix, the parity check vector selected from the ordered non-zero parity check vectors remaining in the set.

8. The method of claim 1, further comprising adding redundant rows to the parity check matrix.

9. The method of claim 1, wherein the linear block code is a Reed-Solomon code.

10. An apparatus configured to generate a parity check matrix for iterative decoding of a linear block code, the apparatus comprising:
    a processor configured to determine a set of parity check vectors for the linear block code, order according to Hamming weight non-zero parity check vectors of the set, select a criterion for generating the parity check matrix, and build the parity check matrix by incrementally selecting according to the criterion a parity check vector for each consecutive row of the parity check matrix, wherein the parity check vector is selected from the ordered non-zero parity check vectors remaining in the set, and modify the parity check matrix including performing one or more row operations to form in the modified parity check matrix a sparse sub-matrix corresponding to a possible erasure pattern in a received codeword of the linear block code.

11. The apparatus of claim 10, wherein the processor is configured to determine the set of parity check vectors including determining the set of all unique parity check vectors for the linear block code.

12. The apparatus of claim 10, wherein
the criterion is a parity check matrix having a minimum weight; and
the processor is configured to build the parity check matrix by incrementally selecting a next ordered non-zero parity check vector remaining in the set for each consecutive row of the parity check matrix.

13. The apparatus of claim 10, wherein
the criterion is a parity check matrix having a low weight; and
the processor is configured to build the parity check matrix by incrementally selecting a parity check vector with a Hamming weight less than or equal to a threshold weight for each consecutive row of the parity check matrix, wherein the parity check vector is selected from the ordered non-zero parity check vectors remaining in the set.

14. The apparatus of claim 10, wherein
the criterion is a parity check matrix having a regular degree profile; and
the processor is configured to build the parity check matrix by incrementally selecting a parity check vector that minimizes column weight variance of the parity check matrix being built, wherein the parity check vector is selected for each consecutive row of the parity check matrix and selected from the ordered non-zero parity check vectors remaining in the set.

15. The apparatus of claim 10, wherein
the criterion is a parity check matrix having an irregular degree profile; and
the processor is configured to build the parity check matrix by incrementally selecting a parity check vector that minimizes square error between an interpolated column weight cumulative distribution function of the parity check matrix being built and a target column weight cumulative distribution function having the irregular degree profile, wherein the parity check vector is selected for each consecutive row of the parity check matrix and selected from the ordered non-zero parity check vectors remaining in the set.

16. The apparatus of claim 10, wherein
the criterion is a parity check matrix having few length-4 cycles; and
the processor is configured to build the parity check matrix by incrementally selecting a parity check vector that minimizes a maximum inner product between previously selected parity check vectors of the parity check matrix being built and a candidate parity check vector considered for selection, wherein the parity check vector is selected for each consecutive row of the parity check matrix and selected from the ordered non-zero parity check vectors remaining in the set.

17. The apparatus of claim 10, wherein the processor is further configured to add redundant rows to the parity check matrix.

18. The apparatus of claim 10, wherein the linear block code is a Reed-Solomon code.

19. A computer program product comprising:
a non-transitory processor-readable medium storing processor-readable instructions configured to cause a processor to:

determine a set of parity check vectors for the linear block code;
order according to Hamming weight non-zero parity check vectors of the set;
select a criterion for generating the parity check matrix;
build the parity check matrix by incrementally selecting according to the criterion a parity check vector for each consecutive row of the parity check matrix, the parity check vector selected from the ordered non-zero parity check vectors remaining in the set; and
modify the parity check matrix by performing one or more row operations to form in the modified parity check matrix a sparse sub-matrix corresponding to a possible erasure pattern in a received codeword of the linear block code.

20. The product of claim 19, wherein the instructions configured to cause the processor to determine the set of parity check vectors include instructions configured to cause the processor to determine the set of all unique parity check vectors for the linear block code.

21. The product of claim 19, wherein
the criterion is a parity check matrix having a minimum weight; and
the instruction configured to cause the processor to build the parity check matrix include instructions configured to cause the processor to incrementally select a next ordered non-zero parity check vector remaining in the set for each consecutive row of the parity check matrix.

22. The product of claim 19, wherein
the criterion is a parity check matrix having a low weight; and
the instructions configured to cause the processor to build the parity check matrix include instructions configured to cause the processor to incrementally select a parity check vector with a Hamming weight less than or equal to a threshold weight for each consecutive row of the parity check matrix, the parity check vector selected from the ordered non-zero parity check vectors remaining in the set.

23. The product of claim 19, wherein
the criterion is a parity check matrix having a regular degree profile; and
the instructions configured to cause the processor to build the parity check matrix include instructions configured to cause the processor to incrementally select a parity check vector that minimizes column weight variance of the parity check matrix being built, the parity check vector selected for each consecutive row of the parity check matrix, the parity check vector selected from the ordered non-zero parity check vectors remaining in the set.

24. The product of claim 19, wherein
the criterion is a parity check matrix having an irregular degree profile; and
the instructions configured to cause the processor to build the parity check matrix include instructions configured to cause the processor to incrementally select a parity check vector that minimizes square error between an interpolated column weight cumulative distribution function of the parity check matrix being built and a target column weight cumulative distribution function having the irregular degree profile, the parity check vector selected for each consecutive row of the parity check matrix, the parity check vector selected from the ordered non-zero parity check vectors remaining in the set.

25. The product of claim 19, wherein the criterion is a parity check matrix having few length-4 cycles; and the instructions configured to cause the processor to build the parity check matrix include instructions configured to cause the processor to incrementally select a parity check vector that minimizes a maximum inner product between previously selected parity check vectors of the parity check matrix being built and a candidate parity check vector considered for selection, the parity check vector selected for each consecutive row of the parity check matrix, the parity check vector selected from the ordered non-zero parity check vectors remaining in the set.

26. The product of claim 19, wherein the instructions are further configured to cause the processor to add redundant rows to the parity check matrix.

27. The product of claim 19, wherein the linear block code is a Reed-Solomon code.

28. An apparatus configured to generate a parity check matrix for iterative decoding of a linear block code, the apparatus comprising:

means for determining a set of parity check vectors for the linear block code;

means for ordering according to Hamming weight non-zero parity check vectors of the set;

means for selecting a criterion for generating the parity check matrix;

means for building the parity check matrix by incrementally selecting according to the criterion a parity check vector for each consecutive row of the parity check matrix, the parity check vector selected from the ordered non-zero parity check vectors remaining in the set; and means for modifying the parity check matrix by performing one or more row operations to form in the modified parity check matrix a sparse sub-matrix corresponding to a possible erasure pattern in a received codeword of the linear block code.

29. The apparatus of claim 28, wherein the means for determining the set of parity check vectors include means for determining the set of all unique parity check vectors for the linear block code.

30. The apparatus of claim 28, wherein the criterion is a parity check matrix having a minimum weight; and the means for building the parity check matrix include means for incrementally selecting a next ordered non-zero parity check vector remaining in the set for each consecutive row of the parity check matrix.

31. The apparatus of claim 28, wherein the criterion is a parity check matrix having a low weight; and the means for building the parity check matrix include means for incrementally selecting a parity check vector with a Hamming weight less than or equal to a threshold weight for each consecutive row of the parity check matrix, the parity check vector selected from the ordered non-zero parity check vectors remaining in the set.

32. The apparatus of claim 28, wherein the criterion is a parity check matrix having a regular degree profile; and the means for building the parity check matrix include means for incrementally selecting a parity check vector that minimizes column weight variance of the parity check matrix being built, the parity check vector selected for each consecutive row of the parity check matrix, the parity check vector selected from the ordered non-zero parity check vectors remaining in the set.

33. The apparatus of claim 28, wherein the criterion is a parity check matrix having an irregular degree profile; and the means for building the parity check matrix include means for incrementally selecting a parity check vector that minimizes square error between an interpolated column weight cumulative distribution function of the parity check matrix being built and a target column weight cumulative distribution function having the irregular degree profile, the parity check vector selected for each consecutive row of the parity check matrix, the parity check vector selected from the ordered non-zero parity check vectors remaining in the set.

34. The apparatus of claim 28, wherein the criterion is a parity check matrix having few length-4 cycles; and the means for building the parity check matrix include means for incrementally selecting a parity check vector that minimizes a maximum inner product between previously selected parity check vectors of the parity check matrix being built and a candidate parity check vector considered for selection, the parity check vector selected for each consecutive row of the parity check matrix, the parity check vector selected from the ordered non-zero parity check vectors remaining in the set.

35. The apparatus of claim 28, further comprising means for adding redundant rows to the parity check matrix.

36. The apparatus of claim 28, wherein the linear block code is a Reed-Solomon code.

* * * * *